(12) United States Patent
Kang et al.

(10) Patent No.: US 11,737,328 B2
(45) Date of Patent: Aug. 22, 2023

(54) DISPLAY DEVICE

(71) Applicant: SAMSUNG DISPLAY CO., LTD., Yongin-si (KR)

(72) Inventors: Kinyeng Kang, Yongin-si (KR); Hyun Kim, Yongin-si (KR); Seungmin Song, Yongin-si (KR); Taehoon Yang, Yongin-si (KR); Seunghwan Cho, Yongin-si (KR); Seonbeom Ji, Yongin-si (KR); Jonghyun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 37 days.

(21) Appl. No.: 17/474,244

(22) Filed: Sep. 14, 2021

(65) Prior Publication Data

US 2021/0408215 A1 Dec. 30, 2021

Related U.S. Application Data

(62) Division of application No. 16/853,916, filed on Apr. 21, 2020, now Pat. No. 11,152,450.

(30) Foreign Application Priority Data

Jul. 3, 2019 (KR) .......................... 10-2019-0080307

(51) Int. Cl.
*H01L 27/32* (2006.01)
*H10K 59/131* (2023.01)
(Continued)

(52) U.S. Cl.
CPC ......... *H10K 59/131* (2023.02); *G09G 3/3266* (2013.01); *G09G 3/3275* (2013.01); *H10K 59/88* (2023.02); *G09G 2330/021* (2013.01)

(58) Field of Classification Search
None
See application file for complete search history.

(56) References Cited

U.S. PATENT DOCUMENTS

| 9,401,122 | B2 | 7/2016 | Jo et al. |
| 10,629,664 | B2 * | 4/2020 | Lin ....................... H10K 59/131 |

(Continued)

FOREIGN PATENT DOCUMENTS

| CN | 108873510 | 11/2018 |
| EP | 3293767 | 3/2018 |

(Continued)

OTHER PUBLICATIONS

European Search Report dated Nov. 10, 2020, issued in corresponding European Patent Application No. 20183516.2.

*Primary Examiner* — Ali Naraghi
(74) *Attorney, Agent, or Firm* — F. Chau & Associates, LLC

(57) ABSTRACT

A display device including: a first data line arranged in a display area of a substrate and extending in a first direction; a second data line arranged in the display area and extending in the first direction; a connecting line arranged in the display area and including a first portion parallel to the first data line, a third portion parallel to the second data line, and a second portion between the first portion and the third portion, wherein the connecting line is electrically connected to the second data line; and an auxiliary line overlapping the first data line or the second data line.

7 Claims, 41 Drawing Sheets

(51) Int. Cl.
   *G09G 3/3266*   (2016.01)
   *G09G 3/3275*   (2016.01)
   *H10K 59/88*    (2023.01)

(56) References Cited

U.S. PATENT DOCUMENTS

| | | | |
|---|---|---|---|
| 10,748,981 B1* | 8/2020 | Rieutort-Louis | H10K 59/131 |
| 2009/0167976 A1* | 7/2009 | Chung | G02F 1/136259 |
| | | | 349/54 |
| 2009/0294771 A1* | 12/2009 | Kim | G02F 1/1309 |
| | | | 257/E33.001 |
| 2014/0176399 A1* | 6/2014 | Lee | G09G 3/20 |
| | | | 345/55 |
| 2017/0047347 A1 | 2/2017 | Kim et al. | |
| 2017/0123249 A1 | 5/2017 | Yoshida et al. | |
| 2017/0287938 A1 | 10/2017 | Lee et al. | |
| 2017/0299930 A1 | 10/2017 | Wei et al. | |
| 2018/0197484 A1 | 7/2018 | Moon et al. | |
| 2018/0211598 A1 | 7/2018 | Yi | |
| 2018/0331124 A1 | 11/2018 | Cho et al. | |
| 2018/0366495 A1* | 12/2018 | Xu | G02F 1/136209 |
| 2019/0165076 A1* | 5/2019 | Lee | H10K 59/131 |
| 2019/0181213 A1* | 6/2019 | Lim | H10K 59/122 |
| 2020/0105206 A1* | 4/2020 | Jo | H10K 59/88 |
| 2021/0005697 A1 | 1/2021 | Kang et al. | |

FOREIGN PATENT DOCUMENTS

| | | |
|---|---|---|
| JP | H11-305671 | 11/1999 |
| KR | 10-2011-0136554 | 12/2011 |
| KR | 10-2016-0001802 | 1/2016 |
| KR | 10-2017-0068796 | 6/2017 |
| KR | 10-2018-0082688 | 7/2018 |

* cited by examiner

DISPLAY DEVICE

CROSS-REFERENCE TO RELATED APPLICATIONS

This application is a divisional application based on U.S. patent application Ser. No. 16/853,916 filed on Apr. 21, 2020, which claims priority under 35 U.S.C. § 119 to Korean Patent Application No. 10-2019-0080307, filed on Jul. 3, 2019, in the Korean Intellectual Property Office, the disclosures of which are incorporated by reference herein in their entireties.

TECHNICAL FIELD

Exemplary embodiments of the inventive concept relate to a display device.

DESCRIPTION OF THE RELATED ART

A display device is a device for the presentation of information in visual form. Various types of display devices have been introduced with characteristics such as thin, light weight, and low power consumption. As a physical button and other components are removed from the front surface of a display device, a dead space of the display device tends to decrease. However, an area of a display area of the display device tends to increase.

SUMMARY

According to one or more exemplary embodiments of the inventive concept, a display device includes a first data line arranged in a display area of a substrate and extending in a first direction, a second data line arranged in the display area and extending in the first direction, a connecting line arranged in the display area and including a first portion parallel to the first data line, a third portion parallel to the second data line, and a second portion between the first portion and the third portion, wherein an end portion of the third portion is connected to the second data line, and an auxiliary line overlapping the first data line or the second data line.

The auxiliary line may be located in a same layer as the connecting line, and the auxiliary line and the connecting line are spaced apart from each other.

The auxiliary line may include a first auxiliary line overlapping the first data line, and a second auxiliary line overlapping the second data line.

A length of the first auxiliary line may be different from a length of the second auxiliary line.

The display device may further include: a first power line adjacent to the first data line; and a second power line adjacent to the second data line, wherein the first auxiliary line may be connected to the first power line and the second auxiliary line may be connected to the second power line.

The display device may further include a third auxiliary line overlapping the second data line and connected to the second data line.

The second portion of the connecting line may extend in a second direction perpendicular to the first direction.

The third portion of the connecting line may be connected to the second data line at a portion other than the end portion of the third portion of the connecting line.

The auxiliary line may include a first auxiliary line overlapping the second data line and connected to the second data line.

The auxiliary line may be separated by the second portion of the connecting line.

The display area may include a first area in which the connecting line is arranged and a second area, and the display device may further include a dummy line arranged in the second area and located on the same layer as the connecting line.

The dummy line may be connected to the auxiliary line.

The dummy line may be connected to a power line for supplying a power voltage to a pixel.

According to one or more exemplary embodiments of the inventive concept, a display device includes: a substrate having a display area including a first area and a second area; a data line arranged in the first area and the second area and extending in a first direction; a connecting line arranged in the first area, the connecting line including a first portion and a third portion extending in the first direction and spaced apart from each other and a second portion between the first portion and the third portion; and a first auxiliary line arranged in the second area and overlapping the data line.

The display device may further include: a power line arranged in the first area and the second area and extending in the first direction, wherein the first auxiliary line may be connected to the power line.

The first auxiliary line may be connected to the data line.

The data line may include a first data line and a second data line, wherein the first portion of the connecting line may be parallel to the first data line and the third portion of the connecting line may be parallel to the second data line, and the display device may further include a second auxiliary line overlapping the first data line and a third auxiliary line overlapping the second data line, the second and third auxiliary lines being arranged in the first area.

The display device may further include: a power line arranged in the first area and the second area and extending in the first direction, wherein the second auxiliary line may be connected to the power line.

The third auxiliary line may be connected to the second data line.

The third portion of the connecting line may be connected to the second data line.

According to an exemplary embodiment of the inventive concept, a display device includes: a first data line; a second data line adjacent to the first data line; a connecting line connected to the second data line, the connecting line including a first portion parallel and adjacent to the first data line, a third portion parallel and adjacent to the second data line and a second portion connected to the first portion and the third portion, the second portion extending perpendicular to and overlapping the first and second data lines; a first auxiliary line overlapping the first data line; and a second auxiliary line overlapping the second data line.

The first auxiliary line may overlap the first data line in a lengthwise direction of the first data line and the second auxiliary line may overlap the second data line in a lengthwise direction of the second data line.

The display device may further include a third auxiliary line connected to the second data line.

BRIEF DESCRIPTION OF THE DRAWINGS

The above and other features of the inventive concept will be more apparent by describing in detail exemplary embodiments thereof with reference to the accompanying drawings, in which.

DETAILED DESCRIPTION OF THE EMBODIMENTS

Figure 1:
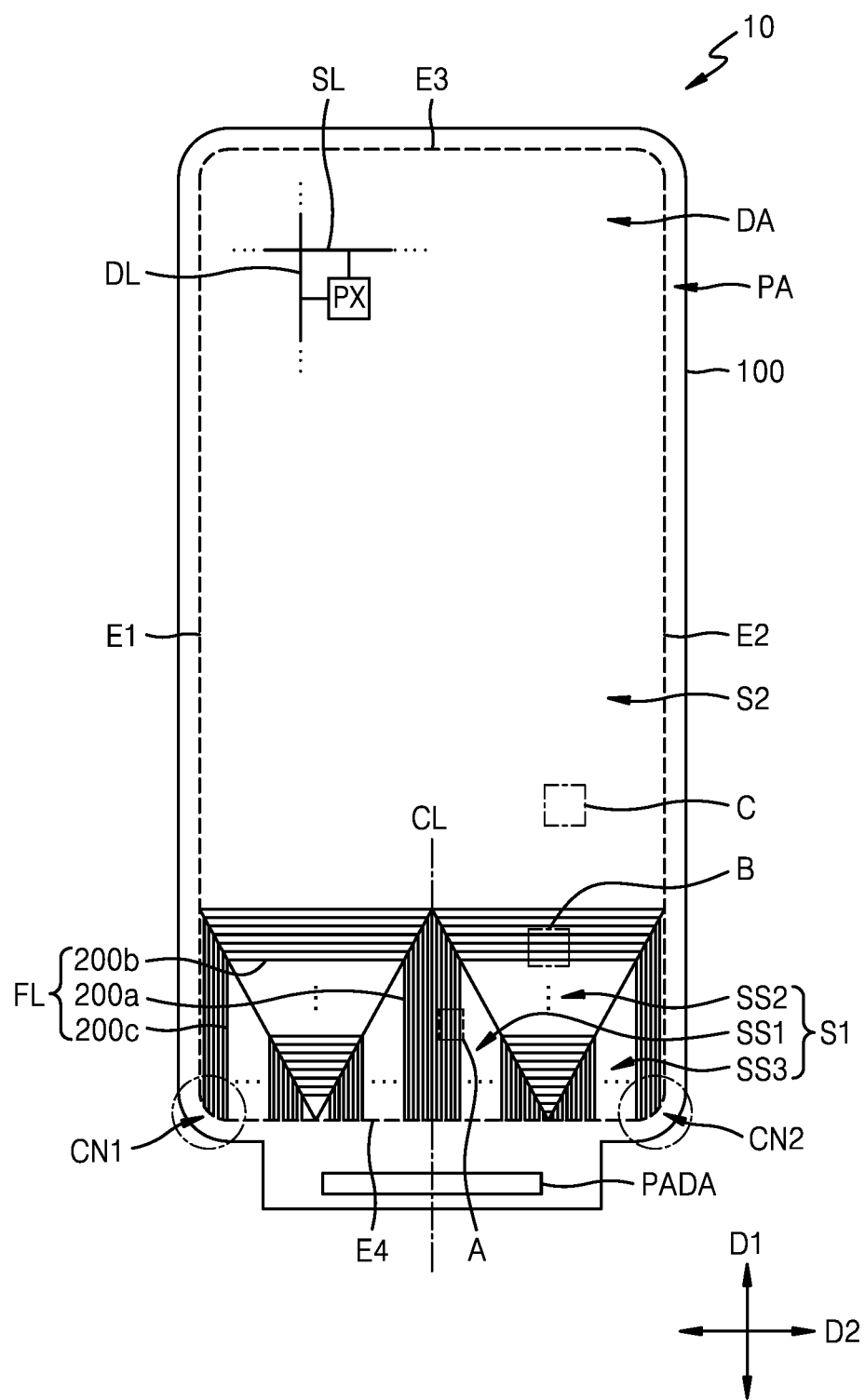
FIG. 1 is a plan view illustrating a display panel according to an exemplary embodiment of the inventive concept.

Exemplary embodiments of the inventive concept will now be described with reference to the accompanying drawings. The inventive concept may, however, be embodied in many different forms and should not be construed as being limited to the embodiments set forth herein.

The singular forms "a," "an," and "the" used herein include the plural forms as well, unless the context clearly indicates otherwise.

It will be further understood that, when a layer, region, or element is referred to as being "on" another layer, region, or element, it can be directly on the other layer, region, or element, or intervening layers, regions, or elements may be present.

Sizes of elements in the drawings may be exaggerated or reduced for convenience of explanation. In addition, like reference numerals may refer to like elements throughout the specification.

When a wire is referred to as 'extending in a first direction or a second direction', the wire not only may extend in a linear shape but may extend in a zigzag or curved shape in the first direction or the second direction.

The phrase "in a plan view" may refer to a view of a target portion seen from above, and the phrase "in a cross-sectional view" may refer to a vertical cross-sectional view of a target portion seen from the side. The term "overlap" may include overlapping "in a plan view" and "in a cross-sectional view".

FIG. 1 is a plan view illustrating a display panel 10 according to an exemplary embodiment of the inventive concept.

Referring to FIG. 1, the display panel 10 has a display area DA for displaying an image and a peripheral area PA located outside the display area DA. A substrate 100 included in the display panel 10 may have the display area DA and the peripheral area PA.

Edges of the display area DA may form a shape similar to a rectangle or a square. As illustrated in FIG. 1, a first corner CN1 of the edge of the display area DA may have a round shape. For example, the display area DA may include a first edge E1 and a second edge E2 facing each other and a third edge E3 and a fourth edge E4 facing each other. The third edge E3 and the fourth edge E4 may be between the first edge E1 and the second edge E2. A pad area PADA is adjacent to the fourth edge E4 from among the first to fourth edges E1 to E4. In this regard, the first corner CN1 having a round shape connects the first edge E1 to the fourth edge E4. In addition, a second corner CN2 of the edge of the display area DA may also have a round shape. The second corner CN2 connects the second edge E2 to the fourth edge E4. Although the first and second corners CN1 and CN2 of the edge of the display area DA are described as having a round shape, another portion of the edge of the display area DA may have a round shape.

A plurality of pixels PX and wires for applying electrical signals to the plurality of pixels PX may be located in the display area DA.

Each of the plurality of pixels PX may include a display element and a circuit portion for driving the display element.

For example, the display element may include an organic light-emitting diode, and the circuit portion may include a plurality of transistors, a capacitor, etc.

Signal lines for applying electrical signals to the plurality of pixels PX may include a plurality of scan lines SL, a plurality of data lines DL, etc. Each of the plurality of data lines DL may extend in a first direction D1, and each of the plurality of scan lines SL may extend in a second direction D2. The plurality of scan lines SL, for example, may be arranged in a plurality of rows to transmit scan signals to the pixels PX, and the plurality of data lines DL, for example, may be arranged in a plurality of columns to transmit data signals to the pixels PX. Each of the plurality of pixels PX may be connected to a corresponding scan line SL from among the plurality of scan lines SL and a corresponding data line DL from among the plurality of data lines DL.

In addition, connecting lines FL may be arranged in the display area DA to transmit an electrical signal supplied from the pad area PADA to wires connected to the pixels PX. For example, the connecting lines FL may be connected to the data lines DL to transmit data signals supplied from the pad area PADA to the data lines DL. Each of the connecting lines FL may be located on a different layer from the scan lines SL and the data lines DL of the pixels PX.

Connecting lines FL arranged on the left side of a virtual central line, in other words, a central line CL, extending through the center of the of the display panel 10 along the first direction D1 and connecting lines FL arranged on the right side of the central line CL may be symmetrical about the central line CL.

Each of the connecting lines FL may include a first portion 200a and a third portion 200c, which extend in the first direction D1, and a second portion 200b extending in the second direction D2. The second portion 200b may connect the first portion 200a to the third portion 200c, and the first portion 200a, the second portion 200b, and the third portion 200c may be integrally formed. The first portion 200a may be arranged at or near the central line CL, and the third portion 200c may be arranged at or near the first and second corners CN1 and CN2.

The display area DA may be partitioned into a plurality of areas according to where the connecting lines FL are arranged. For example, the display area DA may include a first area S1 where the connecting lines FL are arranged and a second area S2 other than the first area S1. The second area S2 may be an area where the connecting lines FL are not located.

The first area S1 may be partitioned into a plurality of sub-areas according to a direction in which the connecting line FL extends. For example, the first area S1 may include a first sub-area SS1 where the first portions 200a of the connecting lines FL extend, a second sub-area SS2 where the second portions 200b of the connecting lines FL extend, and a third sub-area SS3 where the third portions 200c of the connecting lines FL extend. The first sub-area SS1, the second sub-area SS2, and the third sub-area SS3 located on the right side of the central line CL may be respectively symmetrical to a first sub-area SS1, a second sub-area SS2, and a third sub-area SS3 located on the left side of the central line CL.

The peripheral area PA may surround the display area DA. The peripheral area PA, which is an area having no pixels PX arranged therein, may include the pad area PADA, which is an area to which various electronic elements or a printed circuit board are electrically attached. A voltage line or the like for supplying power for driving a display element may be located in the peripheral area PA. A plurality of pads of the pad area PADA may be electrically connected to a film on which a data driver is arranged. FIG. 1 illustrates a chip on film (COF) method in which the data driver is arranged on a film electrically connected to pads arranged on the substrate 100. According to another exemplary embodiment of the inventive concept, the data driver may be directly arranged on the substrate 100 by using a chip on glass (COG) or chip on plastic (COP) method.

FIG. 1 may be a plan view showing states of the substrate 100 and the like during a manufacturing process of a display device. In a final display device or an electronic device such as a smartphone including a display device, a portion of the substrate 100 may be bent to reduce the area of the peripheral area PA recognized by a user.

Figure 2A:
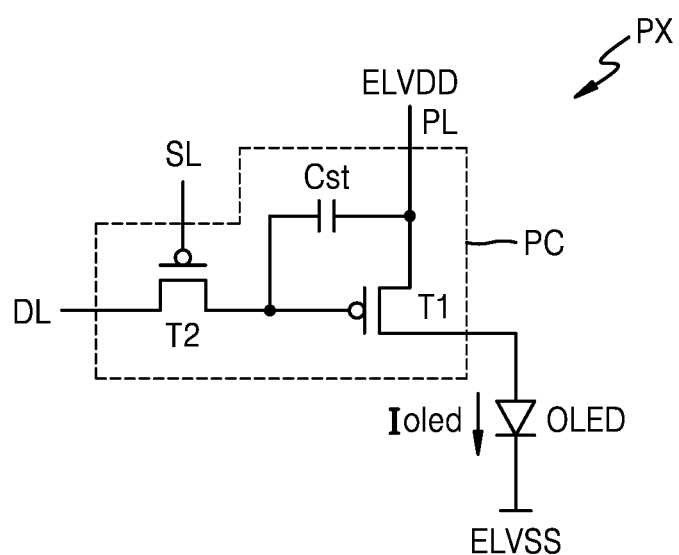
FIGS. 2A and 2B are equivalent circuit diagrams of a pixel arranged in a display panel according to an exemplary embodiment of the inventive concept.
Figure 2B:
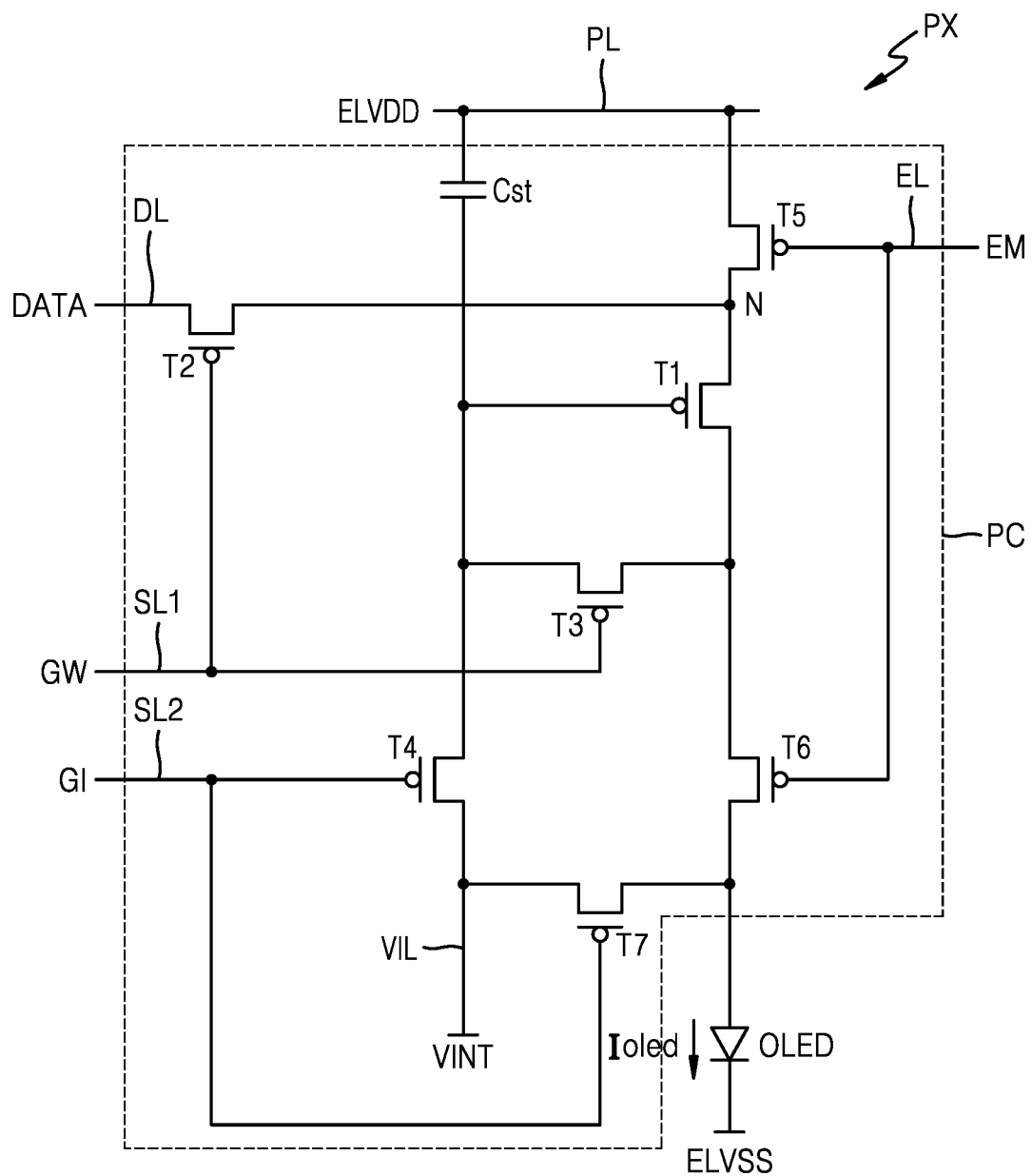

FIGS. 2A and 2B are equivalent circuit diagrams of a pixel PX arranged in a display panel according to an exemplary embodiment of the inventive concept.

Referring to FIG. 2A, the pixel PX includes a pixel circuit PC and an organic light-emitting diode OLED, which is a display element connected to the pixel circuit PC. The pixel circuit PC may include a first transistor T1, a second transistor T2, and a capacitor Cst. Each pixel PX may emit, for example, red, green, blue, or white light, from the organic light-emitting diode OLED. The first transistor T1 and the second transistor T2 may include thin film transistors.

The second transistor T2, which is a switching transistor, may be connected to the scan line SL and the data line DL and may transmit a data signal input from the data line DL to the first transistor T1 according to a switching voltage input to the scan line SL. The capacitor Cst may be connected to the second transistor T2 and a power voltage line PL and may store a voltage corresponding to a difference between a voltage of the data signal received from the second transistor T2 and a first power voltage ELVDD supplied to the power voltage line PL. The power voltage line PL may be spaced apart from the scan line SL or the data line DL in parallel.

The first transistor T1, which is a driving transistor, may be connected to the power voltage line PL and the capacitor Cst and may control a driving current Ioled flowing from the power voltage line PL through the organic light-emitting diode OLED in response to a voltage stored in the capacitor Cst. The organic light-emitting diode OLED may emit light having certain brightness according to the driving current Ioled. An opposite electrode (for example, a cathode) of the organic light-emitting diode OLED may receive a second power voltage ELVSS.

Although FIG. 2A shows that the pixel circuit PC includes two transistors and one capacitor, the present inventive concept is not limited thereto. The number of transistors and the number of capacitors may be variously changed according to design of the pixel circuit PC.

Although FIG. 2B illustrates signal lines SL1, SL2, EL, and DL, an initialization voltage line VIL, and a power voltage line PL provided for each pixel PX, the present inventive concept is not limited thereto. According to another exemplary embodiment of the inventive concept, at least one of the signal lines SL1, SL2, EL, and DL, the initialization voltage line VIL or/and the power voltage line PL may be shared by neighboring pixels.

The signal lines include a first scan line SL1 for transmitting a first scan signal GW, a second scan line SL2 for transmitting a second scan signal GI, an emission control line EL for transmitting an emission control signal EM, and a data line DL crossing the first scan line SL1 and for transmitting a data signal DATA. The second scan line SL2 may be connected to the first scan line SL1 of the next row or the previous row, and the second scan signal GI may be the first scan signal GW of the next row or the previous row.

The power voltage line PL transmits the first power voltage ELVDD to the first transistor T1, and the initialization voltage line VIL transmits an initialization voltage VINT for initializing the first transistor T1 and a pixel electrode of the organic light-emitting diode OLED to the pixel PX.

The first scan line SL1, the second scan line SL2, the emission control line EL, and the initialization voltage line VIL may extend in the first direction D1 and may be mutually spaced apart in respective rows. The data line DL and the power voltage line PL may extend in the second direction D2 and may be mutually spaced apart in respective columns.

The pixel circuit PC of the pixel PX may include first, second, third, fourth, fifth, sixth and seventh transistors T1, T2, T3, T4, T5, T6 and T7 and the capacitor Cst. The first to seventh transistors T1 to T7 may include thin film transistors.

The first transistor T1 is connected to the power voltage line PL via the fifth transistor T5 and is electrically connected to the pixel electrode of the organic light-emitting diode OLED via the sixth transistor T6. The first transistor T1 serves as a driving transistor, and as the data signal DATA is transmitted to the first transistor T1 according to a switching operation of the second transistor T2, the first transistor T1 supplies the driving current Ioled to the organic light-emitting diode OLED.

The second transistor T2 is connected to the first scan line SL1 and the data line DL, and as the second transistor T2 is turned on according to the first scan signal GW received through the first scan line SL1, the second transistor T2 performs a switching operation for transmitting the data signal DATA transmitted through the data line DL to a node N.

The third transistor T3 is connected to the pixel electrode of the organic light-emitting diode OLED via the sixth transistor T6. As the third transistor T3 is turned on according to the first scan signal GW received through the first scan line SL1, the third transistor T3 diode-connects the first transistor T1.

As the fourth transistor T4 is turned on according to the second scan signal GI received through the second scan line SL2, the fourth transistor T4 initializes a gate voltage of the first transistor T1 by transmitting the initialization voltage VINT input to the initialization voltage line VIL to a gate electrode of the first transistor T1.

As the fifth transistor T5 and the sixth transistor T6 are simultaneously turned on according to the emission control signal EM received through the emission control line EL, a current path is formed to allow the driving current baled to flow in a direction from the power voltage line PL to the organic light-emitting diode OLED.

As the seventh transistor T7 is turned on according to the second scan signal GI received through the second scan line SL2, the seventh transistor T7 initializes the pixel electrode of the organic light-emitting diode OLED by transmitting the initialization voltage VINT input to the initialization voltage line VIL to the pixel electrode of the organic light-emitting diode OLED. The seventh transistor T7 may be omitted.

Although FIG. 2B illustrates the fourth transistor T4 and the seventh transistor 17 connected to the second scan line SL2, the present inventive concept is not limited thereto. According to another exemplary embodiment of the inventive concept, the fourth transistor T4 may be connected to the second scan line SL2, and the seventh transistor T7 may be connected to a separate wire and be driven according to a signal transmitted to the wire.

The capacitor Cst may be connected to the power voltage line PL and the gate electrode of the first transistor T1 and may maintain a voltage that is applied to the gate electrode of the first transistor T1 by storing and maintaining a voltage corresponding to a difference between both end voltages of the capacitor Cst.

The organic light-emitting diode OLED may include the pixel electrode and a common electrode facing the pixel electrode, and the second power voltage ELVSS may be applied to the common electrode. The organic light-emitting diode OLED receives the driving current Ioled from the first transistor T1 and thus emits light, thereby displaying an image.

Figure 3:
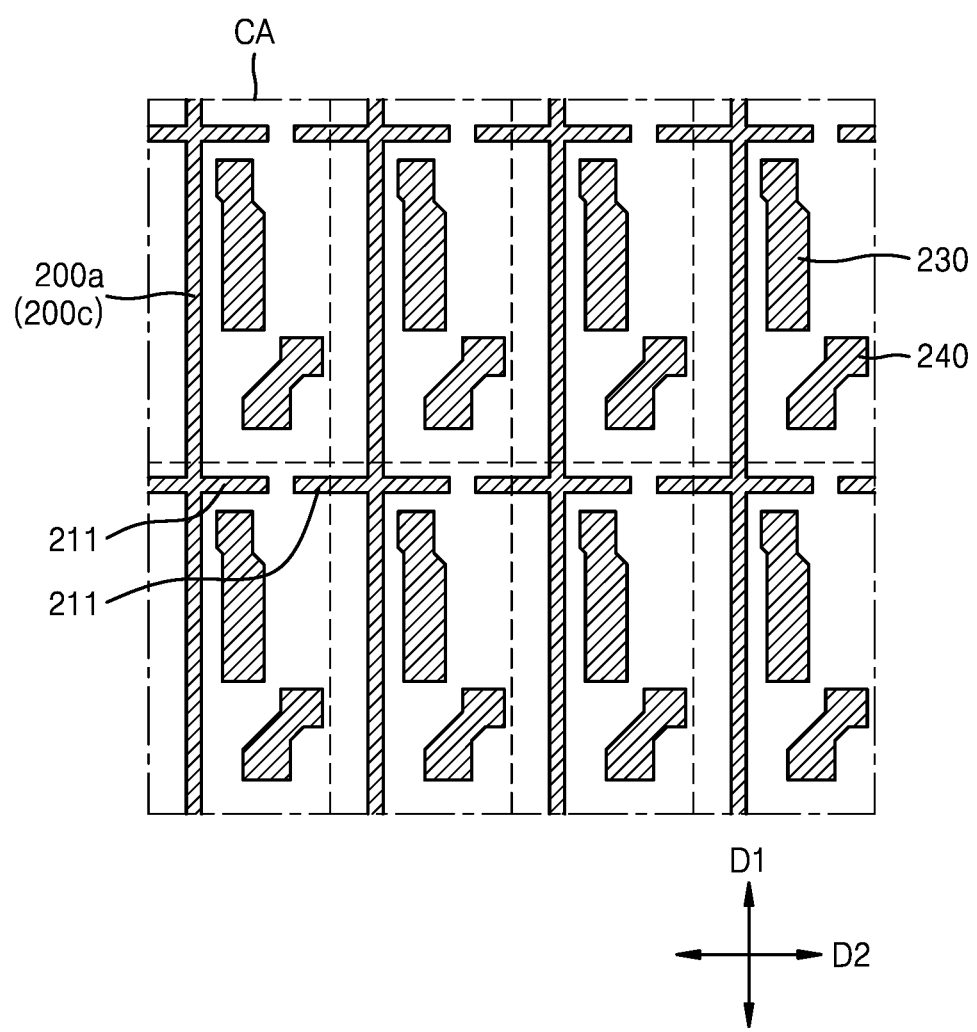
FIG. 3 is a plan view illustrating a region A of FIG. 1.
Figure 4:
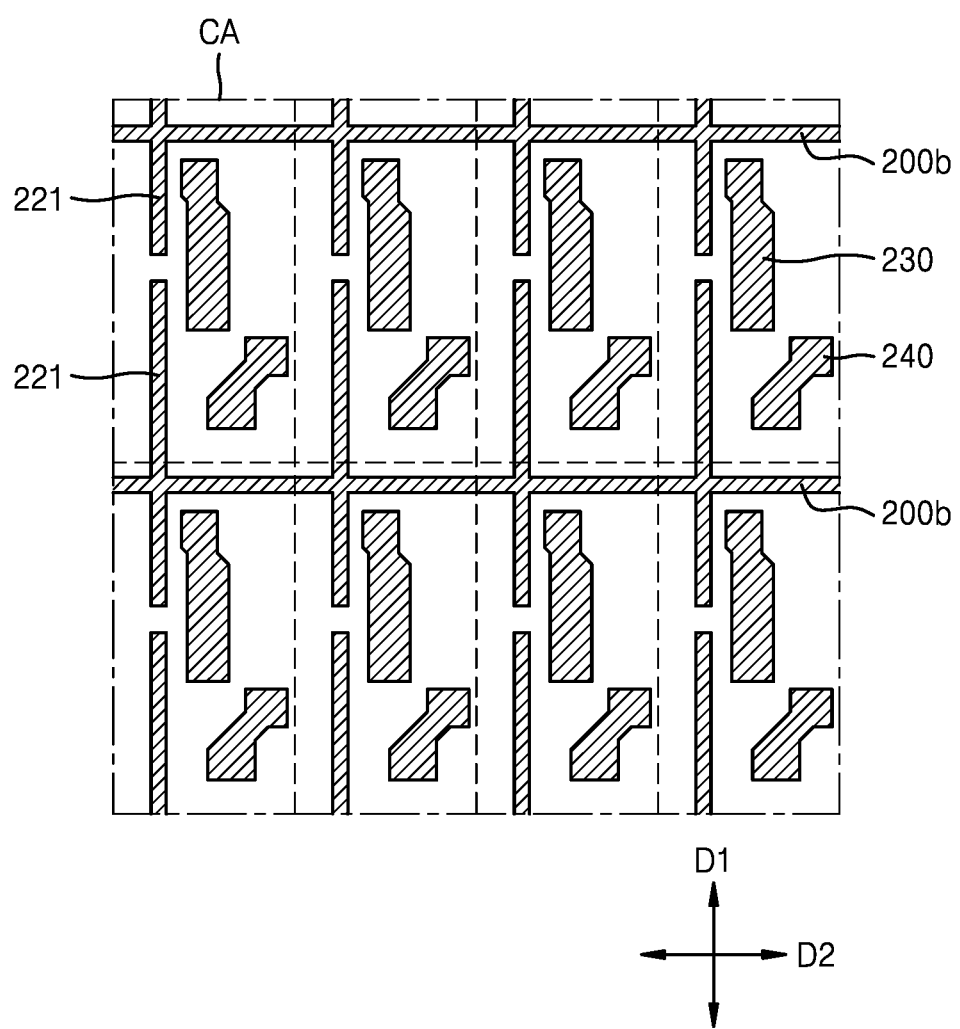
FIG. 4 is a plan view illustrating a region B of FIG. 1.
Figure 5:
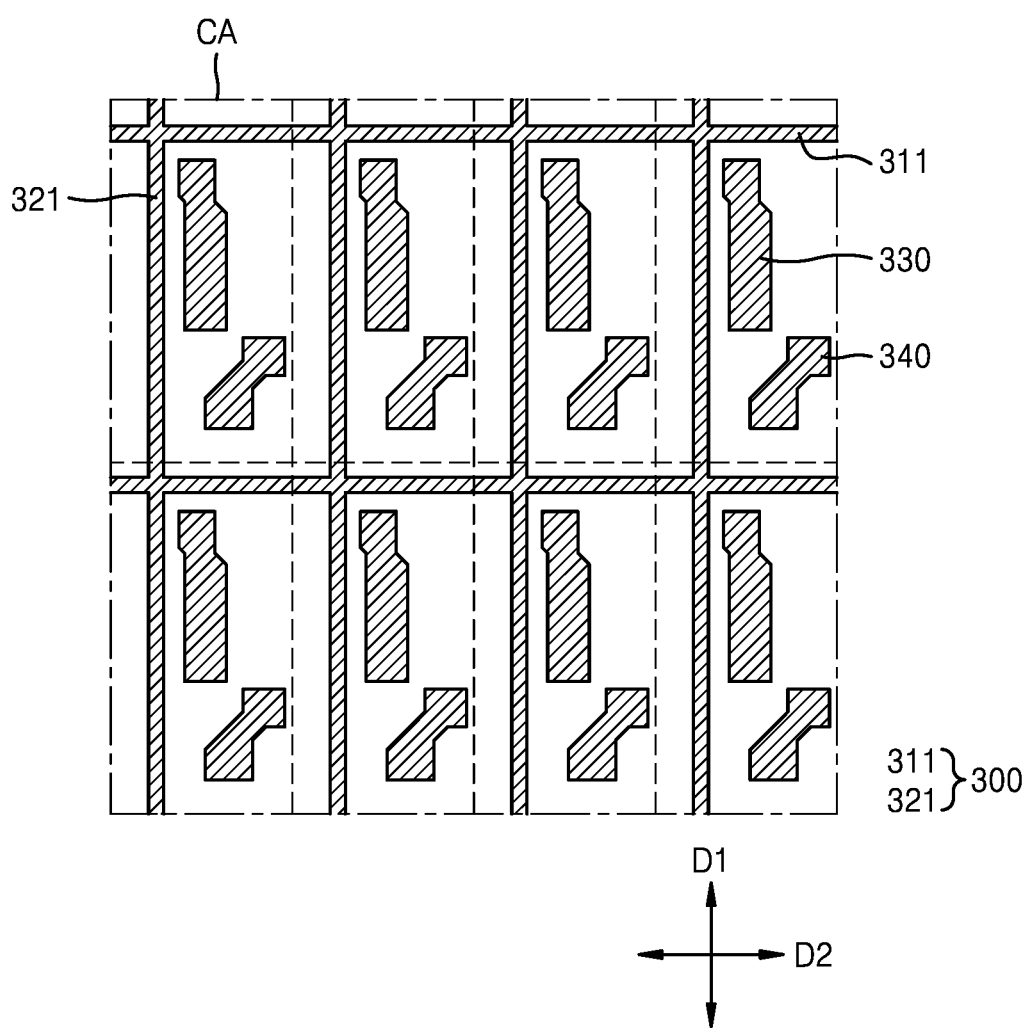
FIG. 5 is a plan view illustrating a region C of FIG. 1.

FIG. 3 is a plan view illustrating a region A of FIG. 1, FIG. 4 is a plan view illustrating a region B of FIG. 1, and FIG. 5 is a plan view illustrating a region C of FIG. 1. FIGS. 3 and 4 illustrate the connecting lines FL arranged on the right side of the central line CL. The illustration of FIGS. 3 and 4 may be equally applied to the connecting lines FL arranged on the left side of the central line CL. FIG. 3 illustrates the first portions 200a of the connecting lines FL arranged at the central line CL. The illustration of FIG. 3 may be equally applied to the third portions 200c arranged at the second corner CN2.

As illustrated in FIG. 3, in the first sub-area SS1, the first portions 200a of the connecting lines FL extend in a direction parallel to the first direction D1, and the first portions 200a may include first branches 211 protruding in the second direction D2.

The first branches 211 may protrude symmetrically from the first portions 200a. For example, the first branches 211 may protrude in two directions from the first portion 200a extending in the first direction D1. For example, the first branches 211 may protrude to the left and to the right of the first portion 200a. In addition, a pair of first branches 211 protruding toward each other from two adjacent first portions 200a among the first portions 200a arranged side by side in the first sub-area SS1 may be located on the same line. To prevent a short circuit between the connecting lines FL, ends of the first branches 211 extending toward each other from two adjacent first portions 200a may be spaced apart from each other by a gap.

Similarly, in the third sub-area SS3, the third portions 200c of the connecting lines FL extend in the direction parallel to the first direction D1, and the third portions 200c may include first branches 211 protruding in the second direction D2. The first branches 211 may protrude symmetrically from the third portions 200c. For example, the first branches 211 may protrude in two directions from the third portion 200c extending in the first direction D1. For example, the first branches 211 may protrude to the left and to the right of the third portion 200c. In addition, a pair of first branches 211 protruding toward each other from two adjacent third portions 200c among the third portions 200c arranged side by side in the third sub-area SS3 may be located on the same line. To prevent a short circuit between the connecting lines FL, ends of the first branches 211 extending toward each other from two adjacent third portions 200c may be spaced apart from each other by a gap.

As illustrated in FIG. 3, in the first sub-area SS1 and the third sub-area SS3, the first portions 200a, the third portions 200c, and the first branches 211 may be arranged in a predetermined pattern in a pixel area CA where pixels are arranged. In FIG. 3, the pixel area CA is partitioned by a dashed line.

As illustrated in FIG. 4, in the second sub-area SS2, the second portions 200b of the connecting lines FL extend in a direction parallel to the second direction D2, and the second portions 200b may include second branches 221 protruding in the first direction D1.

The second branches 221 may protrude symmetrically from the second portions 200b. For example, the second branches 221 may protrude in two directions from the second portion 200b extending in the second direction D2. For example, the second branches 221 may protrude above and below the second portion 200b. In addition, a pair of second branches 221 protruding toward each other from two adjacent second portions 200b among the second portions 200b arranged side by side in the second sub-area SS2 may be located on the same line. To prevent a short circuit between the connecting lines FL, ends of the second branches 221 extending toward each other from two adjacent second portions 200b may be spaced apart from each other by a gap. As illustrated in FIG. 4, in the second sub-area SS2, the second portions 200b and the second branches 221 may be arranged in a predetermined pattern in the pixel area CA where the pixels are arranged.

The positions of gaps between the first branches 211 are different from the positions of gaps between the second branches 221. In addition, patterns of the connecting lines FL arranged in the pixel area CA of the first sub-area SS1 and the third sub-area SS3 are similar to patterns of the connecting lines FL arranged in the pixel area CA of the second sub-area SS2. Therefore, since reflection characteristics of light are similar in the first to third sub-areas SS1, SS2, and SS3, the recognition of the first to third sub-areas SS1, SS2, and SS3 according to an incidence angle of light may be prevented or suppressed.

First dummy patterns 230 and second dummy patterns 240 may be further arranged in the pixel area CA of the first to third sub-areas SS1, SS2, and SS3. The first and second dummy patterns 230 and 240 may be between two adjacent first portions 200a, between two adjacent second portions 200b, and between two adjacent third portions 200c. The first and second dummy patterns 230 and 240 may be located in the same layer as the connecting lines FL. The first and second dummy patterns 230 and 240 may be in a floating state. FIGS. 3 and 4 illustrate that the first dummy pattern 230 and the second dummy pattern 240 are located in the pixel area CA, but the present inventive concept is not limited thereto and dummy patterns in various numbers and shapes may be located inside the pixel area CA. The first and second dummy patterns 230 and 240 may prevent signal interference between a pixel circuit and the connecting lines FL and may ensure pattern density in a manufacturing process.

As illustrated in FIG. 5, a dummy line 300 may be arranged in the second area S2. The dummy line 300 may include a plurality of first portions 321, which extend in the first direction D1 and are spaced apart from each other, and a plurality of second portions 311, which extend in the second direction D2, cross the plurality of first portions 321, and are spaced apart from each other. The dummy line 300 may have a lattice structure in which the plurality of first portions 321 are connected to the plurality of second portions 311. In the second area S2, the dummy line 300 may be arranged in a predetermined pattern in the pixel area CA in which the pixels are arranged. Third dummy patterns 330 and fourth dummy patterns 340 may be further arranged in the pixel area CA. In an exemplary embodiment of the inventive concept, the dummy line 300 and the third and fourth dummy patterns 330 and 340 may be in a floating state. In another exemplary embodiment of the inventive concept, the dummy line 300 may be electrically connected to the power voltage line PL connected to the pixels PX and receive the first power voltage ELVDD. Since the second area S2 includes the dummy line 300, the first area S1 in which the connecting lines FL are arranged and the second area S2 may not be distinguished and recognized by a user.

The dummy line 300 and the third and fourth dummy patterns 330 and 340 may be arranged on the same layer. The dummy line 300 and the third and fourth dummy patterns 330 and 340 may be arranged on the same layer as the connecting lines FL. The dummy line 300 and the third and fourth dummy patterns 330 and 340 may include the same material as the connecting lines FL.

Figure 6:
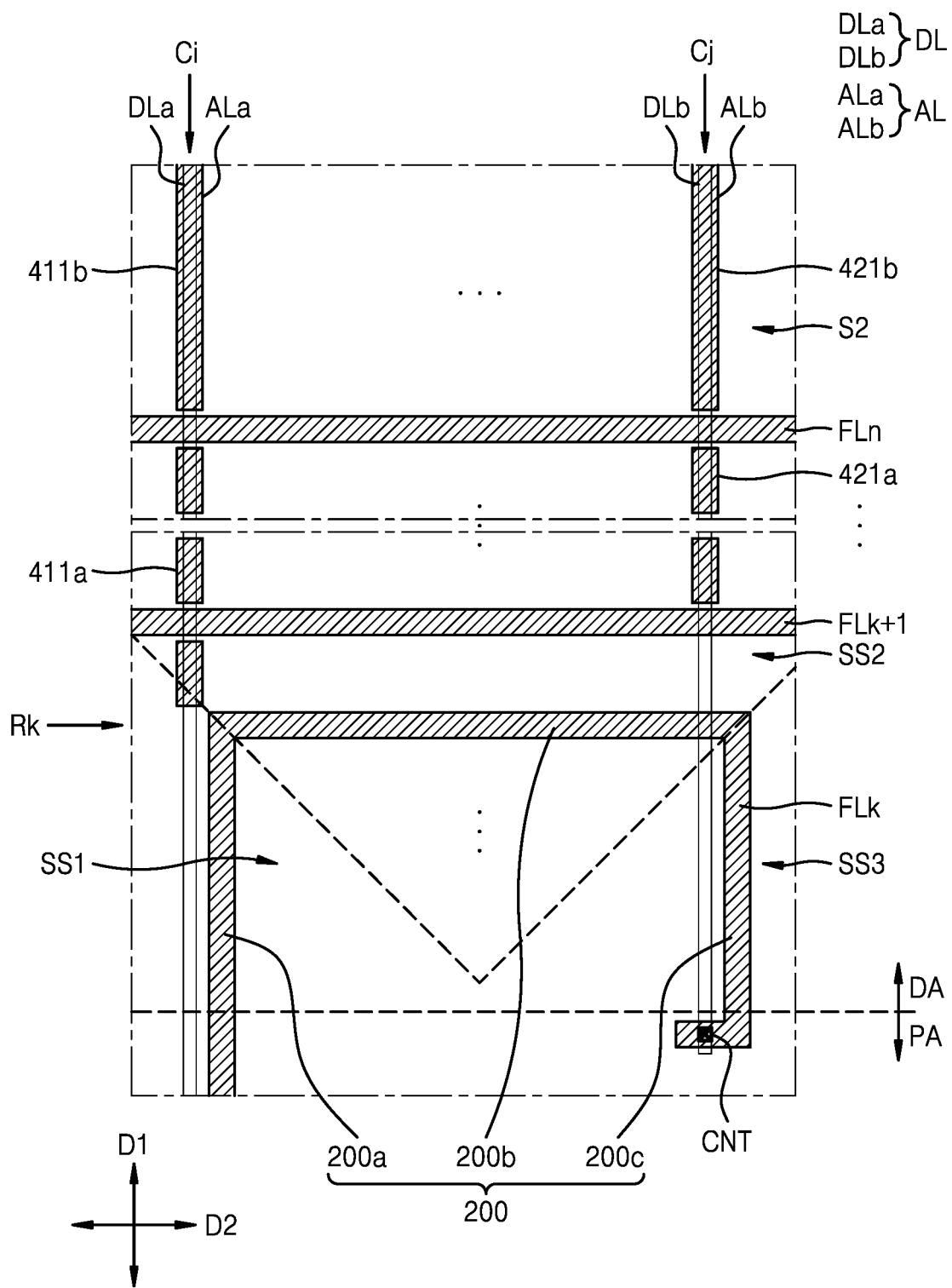
FIG. 6 is a view illustrating the arrangement of wires of a display device according to an exemplary embodiment of the inventive concept.

FIG. 6 is a view illustrating the arrangement of wires of a display device according to an exemplary embodiment of the inventive concept. FIG. 6 shows one of the connecting lines FL arranged on the right side of the central line CL illustrated in FIG. 1. The illustration of FIG. 6 may be equally applied to other connecting lines FL.

Referring to FIGS. 1 and 6, in the display area DA, a plurality of data lines DL may be spaced apart from each other in units of columns. The data lines DL may include a plurality of first data lines DLa and a plurality of second data lines DLb. The first data lines DLa may extend from the pad area PADA to the display area DA and receive a data signal directly from the pad area PADA. In another exemplary embodiment of the inventive concept, the first data lines DLa may be electrically connected to link lines extending from the pad area PADA and may receive a data signal from the pad area PADA through the link lines. The second data lines DLb may be electrically connected to the connecting lines FL and may receive a data signal from the pad area PADA through the connecting lines FL.

Each of the connecting lines FL may include a first portion 200a extending in the first direction D1, a second portion 200b extending in the second direction D2, and a third portion 200c extending in the first direction D1. Each of the first portion 200a and the third portion 200c of each of the connecting lines FL may be arranged in a corresponding column, and the second portion 200b of each of the connecting lines FL may be arranged in a corresponding row. The first portion 200a of each of the connecting lines FL may be arranged in parallel with a corresponding first data line DLa among the plurality of data lines DL. The third portion 200c of each of the connecting lines FL may be arranged in parallel with a corresponding second data line DLb among the plurality of data lines DL and may be electrically connected, via a contact portion CNT, to the corresponding second data line DLb. Hereinafter, a pair of data lines corresponding to a connecting line FL may include a first data line DLa arranged in a column corresponding to the first portion 200a of the connecting line FL and a second data line DLb arranged in a column corresponding to the third portion 200c of the connecting line FL. FIG. 6 illustrates an example in which a second portion 200b of a k-th connecting line FLk arranged on the right side of the central line CL is arranged in a k-th row Rk, a first portion 200a of the k-th connecting line FLk is arranged in parallel with a first data line DLa arranged in an i-th column Ci, and a third portion 200c of the k-th connecting line FLk is arranged in parallel with a second data line DLb arranged in a j-th column Cj.

As the second data line DLb is connected to the connecting line FL, the resistance and capacitance of the entire path through which a data signal is transmitted in the second data line DLb are greater than those in the first data line DLa. As a result, the luminance of pixels connected to the second data line DLb may be different from a target luminance, thereby causing spots in an image.

A display device according to an exemplary embodiment of the inventive concept may further include auxiliary lines AL respectively overlapping a pair of data lines, in other words, the first data line DLa and the second data line DLb, corresponding to the connecting line FL. The auxiliary lines AL may include a first auxiliary line ALa overlapping the first data line DLa and a second auxiliary line ALb overlapping the second data line DLb. To correct a data signal resistive-capacitive (RC) difference between the first data line DLa and the second data line DLb, the length of the first auxiliary line ALa overlapping the first data line DLa may be different from the length of the second auxiliary line ALb overlapping the second data line DLb.

The first auxiliary line ALa may extend in the first direction D1 in the second sub-area SS2 and the second area S2 along the first data line DLa, but may be disconnected by connecting lines FL extending in the second direction D2 in the second sub-area SS2. In other words, portions of the first auxiliary line ALa are separated from each other with connecting lines FL therebetween. The first auxiliary line ALa may include at least one first portion 411a, which is a disconnected section in the second sub-area SS2, and a second portion 411b extending in the second area S2. Similarly, the second auxiliary line ALb may extend in the first direction D1 in the second sub-area SS2 and the second area S2 along the second data line DLb, but may be disconnected by the connecting lines FL extending in the second direction D2 in the second sub-area SS2. The second auxiliary line ALb may include at least one first portion 421a, which is a disconnected section in the second sub-area SS2, and a second portion 421b extending in the second area S2. The sum of the lengths of the at least one first portion 411a and the second portion 411b, which overlap the first data line DLa corresponding to the connecting line FL, may be greater than the sum of the lengths of the at least one first portion 421a and the second portion 421b, which overlap the second data line DLb. In other words, the first auxiliary line ALa may be longer than the second auxiliary line ALb.

FIG. 6 illustrates an example in which the lengths of the first auxiliary line ALa and the second auxiliary line ALb respectively overlapping the first data line DLa and the second data line DLb of the k-th connecting line FLk are different from each other. The first auxiliary line ALa overlapping the first data line DLa includes a plurality of first portions 411a disconnected in every row by the second portions 200b of the other connecting lines FLk+1 to FLn in the second sub-area SS2, and a second portion 411b continuously extending in a plurality of rows in the second area S2. The second auxiliary line ALb overlapping the second data line DLb includes a plurality of first portions 421a disconnected in every row by the second portions 200b of the other connecting lines FLk+1 to FLn in the second sub-area SS2, and a second portion 421b continuously extending in a plurality of rows in the second area S2. The sum of the lengths of the plurality of first portions 411a and the second portion 411b, which overlap the first data line DLa, may be greater than the sum of the lengths of the plurality of first portions 421a and the second portion 421b, which overlap the second data line DLb.

A plurality of power voltage lines PL extending in parallel to the first and second data lines DLa and DLb may be arranged in each column.

The first and second auxiliary lines ALa and ALb of the first area S1, in other words, the first portions 411a and 421a of the first and second auxiliary lines ALa and ALb, may be connected to a corresponding power voltage line PL of the first area S1. The first and second auxiliary lines ALa and ALb of the second area S2, in other words, the second portions 411b and 421b of the first and second auxiliary lines ALa and ALb, may be connected to a corresponding power voltage line PL of the second area S2. The first and second auxiliary lines ALa and ALb of the second area S2 may be connected to the power voltage line PL by being connected to a dummy line 300 of the second area S2. The first and second auxiliary lines ALa and ALb of the first area S1 may be spaced apart from the connecting lines FL.

Figure 7:
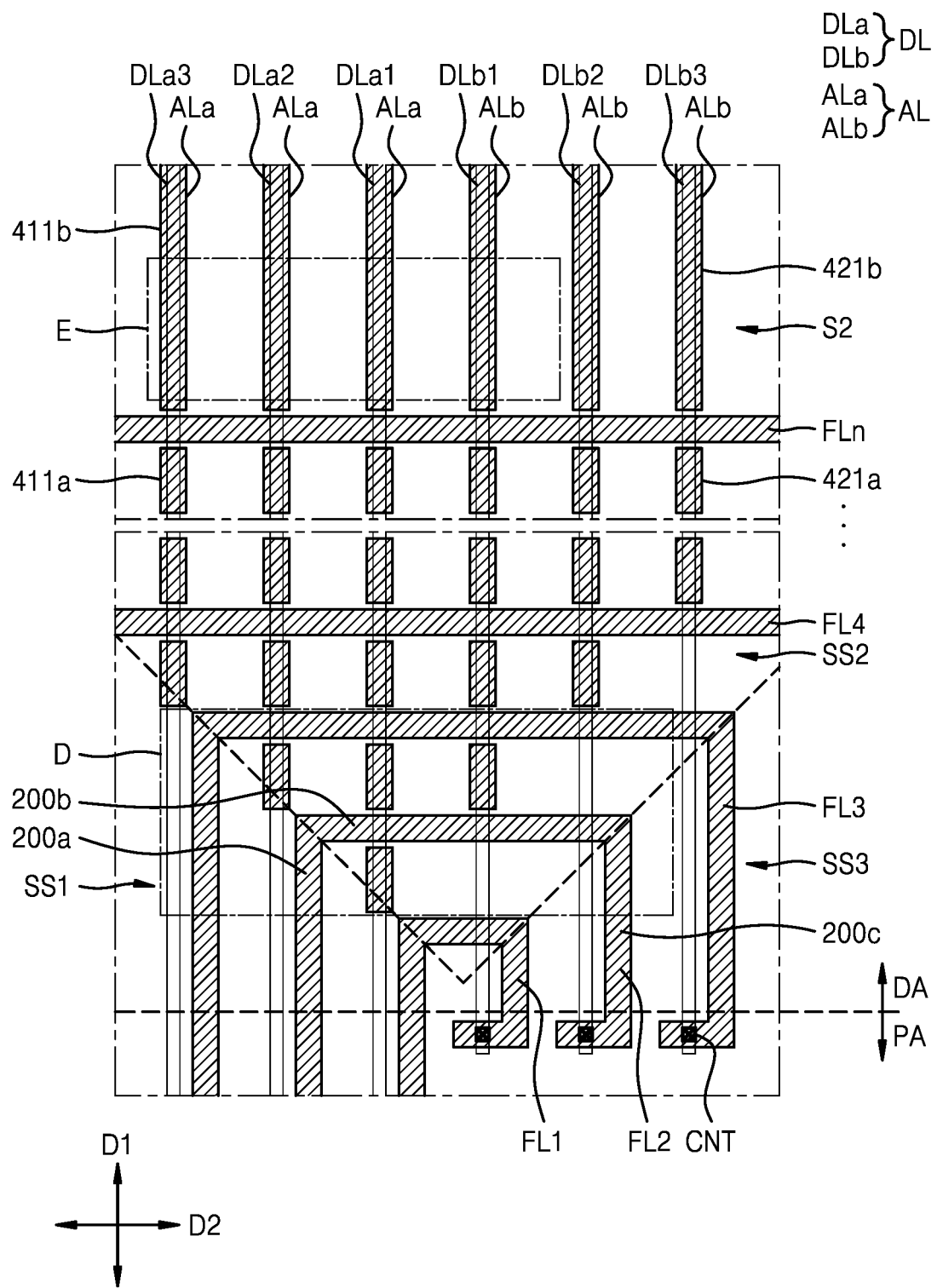
FIGS. 7 and 10 are views illustrating the arrangement of wires of a display device according to an exemplary embodiment of the inventive concept.
Figure 8:
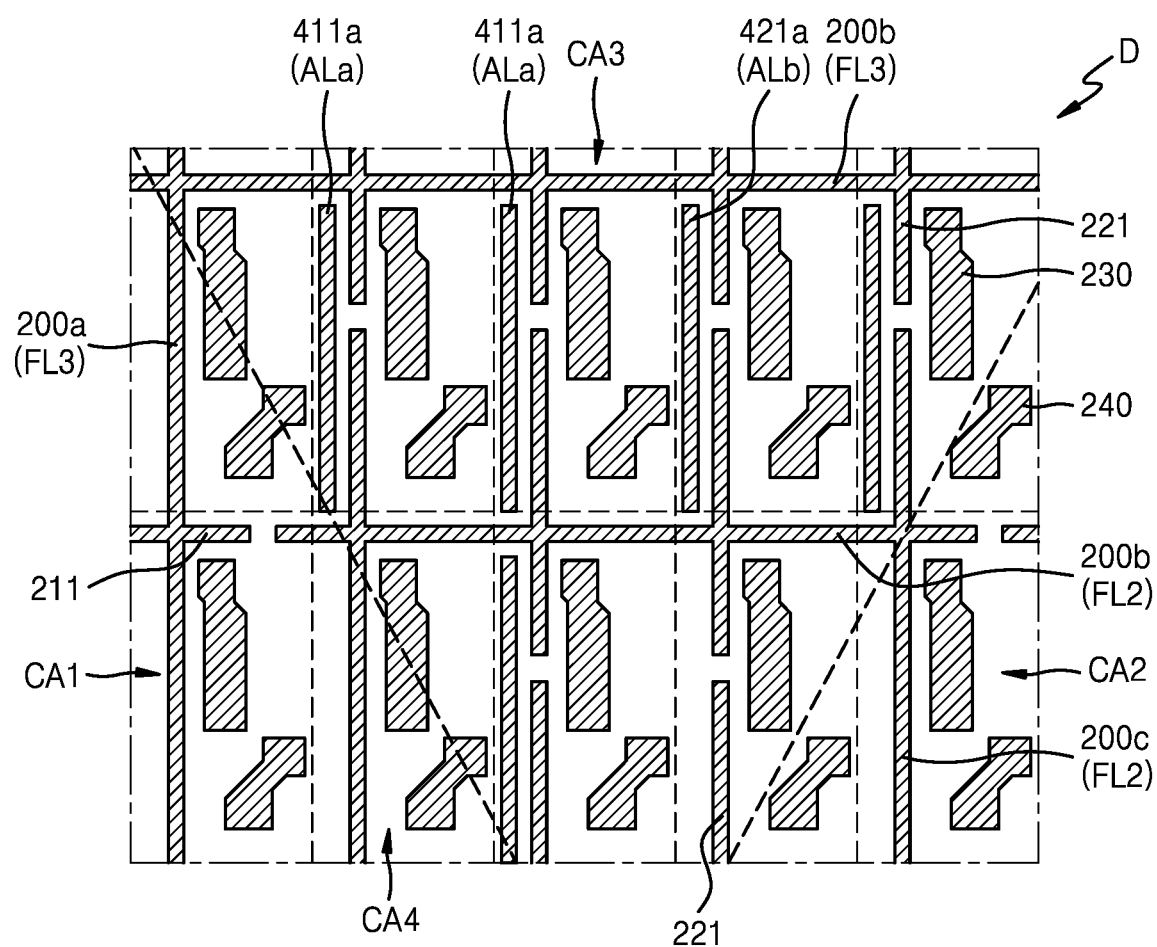
FIG. 8 is a plan view illustrating a region D of FIG. 7.
Figure 9:
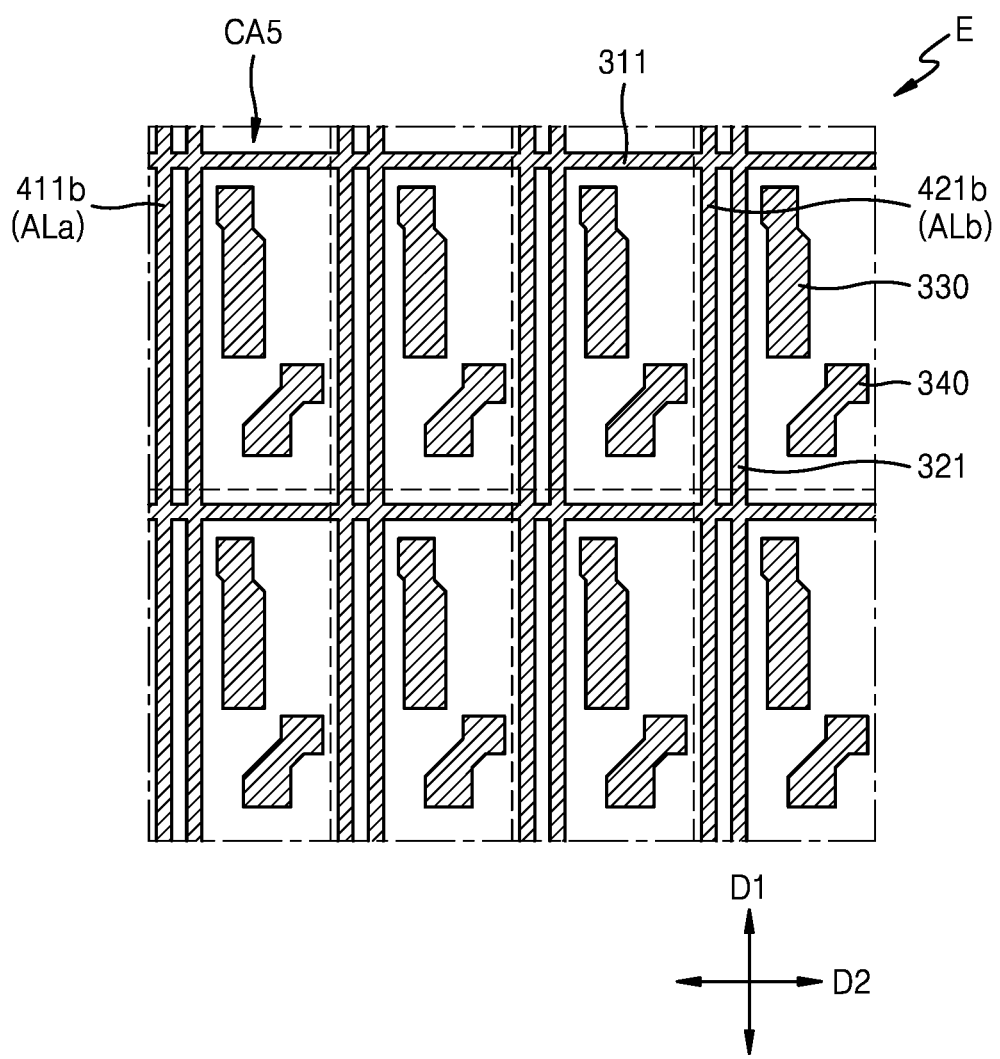
FIG. 9 is a plan view illustrating a region E of FIG. 7.
Figure 10:
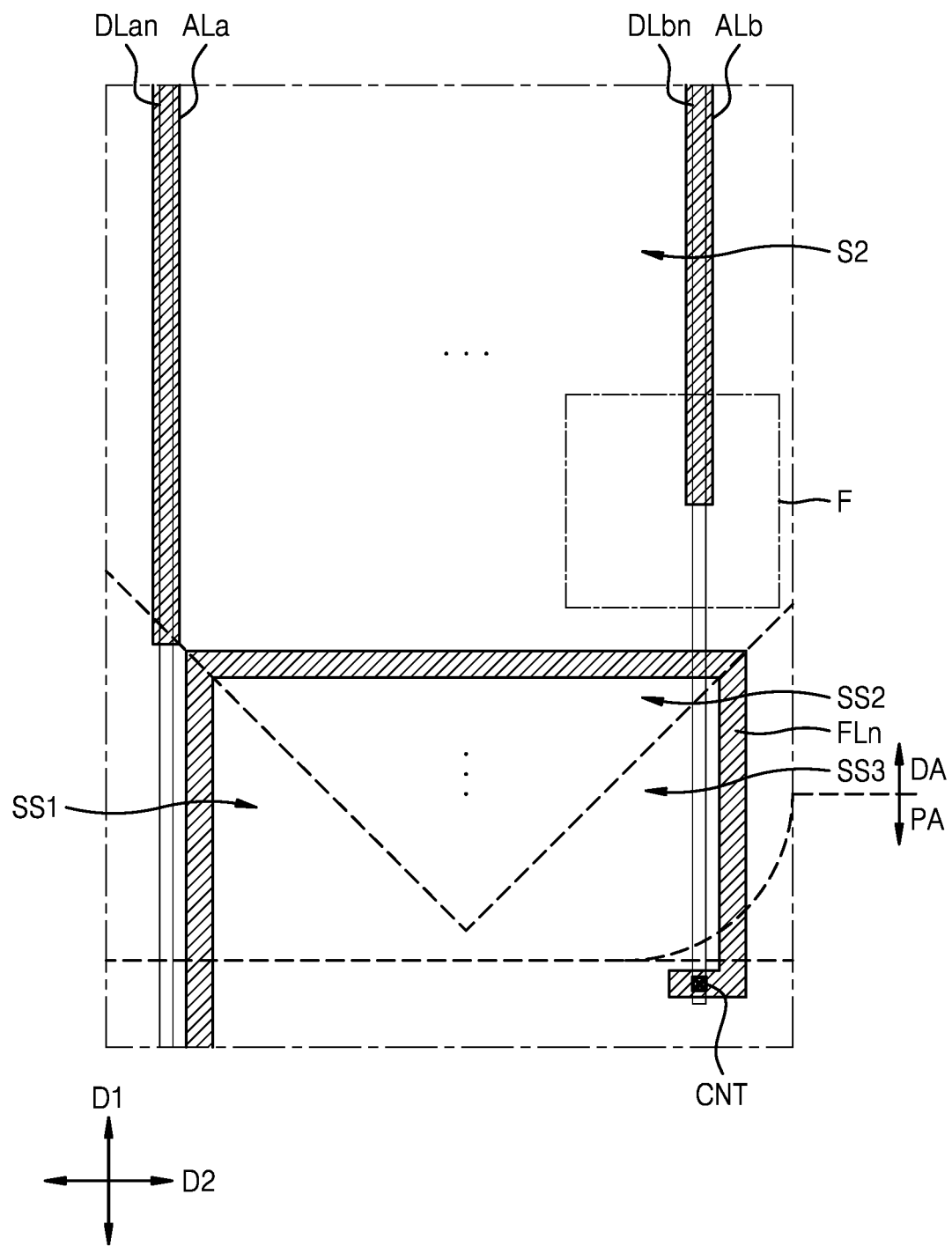
Figure 11:
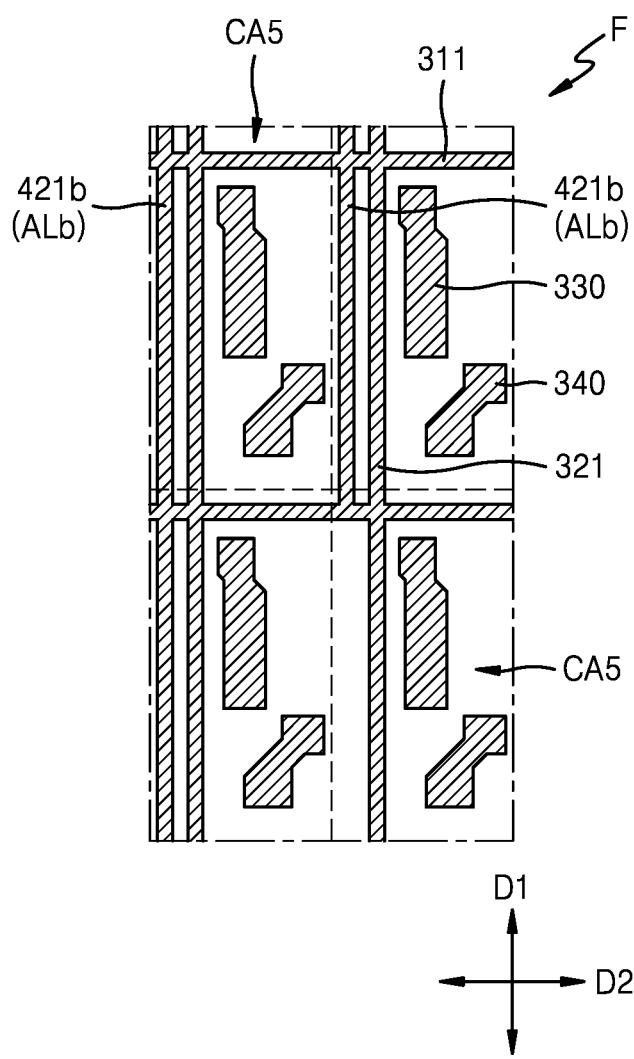
FIG. 11 is a plan view illustrating a region F of FIG. 10.

FIGS. 7 and 10 are views illustrating the arrangement of wires of a display device according to an exemplary embodiment of the inventive concept. FIG. 8 is a plan view illustrating a region D of FIG. 7, and FIG. 9 is a plan view illustrating a region E of FIG. 7. FIG. 11 is a plan view illustrating a region F of FIG. 10. FIGS. 7 and 10 show the connecting lines FL arranged on the right side of the central line CL illustrated in FIG. 1 and this illustration may be equally applied to the connecting lines FL arranged on the left side of the central line CL.

In the display area DA, first to nth connecting lines FL1 to FLn may be arranged on the left and right sides of the central line CL, respectively, in the first area S1. Each of the first to nth connecting lines FL1 to FLn may include a first portion 200a and a third portion 200c, which extend in the first direction D1, and a second portion 200b extending in the second direction D2.

FIG. 7 illustrates pairs of data lines of the first to third connecting lines FL1 to FL3 arranged in the display area DA, in other words, a plurality of first data lines DLa1, DLa2, and DLa3 and a plurality of second data lines DLb1, DLb2, and DLb3. The first portion 200a of the first connecting line FL1 may be parallel to the first data line DLa1, and the third portion 200c of the first connecting line FL1 may be parallel to the second data line DLb1. The first portion 200a of the second connecting line FL2 may be parallel to the first data line DLa2, and the third portion 200c of the second connecting line FL2 may be parallel to the second data line DLb2. The first portion 200a of the third connecting line FL3 may be parallel to the first data line DLa3 (e.g., adjacent to the first data line DLa3), and the third portion 200c of the third connecting line FL3 may be parallel to the second data line DLb3 (e.g., adjacent to the second data line DLb3). The first auxiliary lines ALa may overlap the first data lines DLa1, DLa2, and DLa3 and may be arranged in the second sub-area SS2 and the second area S2. The second auxiliary lines ALb may overlap the second data lines DLb1, DLb2, and DLb3 and may be arranged in the second sub-area SS2 and the second area S2. The auxiliary line AL may not be arranged in the first sub-area SS1 and the third sub-area SS3. The lengths of the first auxiliary lines ALa overlapping the first data lines DLa1, DLa2, and DLa3 may be different from each other. The lengths of the second auxiliary lines ALb overlapping the second data lines DLb1, DLb2, and DLb3 may be different from each other.

FIG. 10 illustrates a pair of data lines, in other words, an n-th first data line DLan and an n-th second data line DLbn, corresponding to the nth connecting line FLn. The first portion 200a of the nth connecting line FLn may be parallel to the first data line DLan, and the third portion 200c of the nth connecting line FLn may be parallel to the second data line DLbn. The first auxiliary line ALa may overlap the first data line DLan and may be arranged in the second area S2. The second auxiliary line ALb may overlap the second data line DLbn and may be arranged in the second area S2.

A plurality of pixels PX may be arranged in the display area DA, and each of the pixels PX may be arranged in a corresponding pixel area.

As illustrated in FIG. 8, the first area S1 of the display area DA may include first to fourth pixel areas CA1, CA2, CA3, and CA4. In the first pixel area CA1, pixels positioned in the first sub-area SS1 may be arranged. In the second pixel area CA2, pixels positioned in the third sub-area SS3 may be arranged. In the third pixel area CA3, pixels positioned in the second sub-area 552 may be arranged. In the fourth pixel area CA4, pixels positioned at a boundary between the first sub-area SS1 and the second sub-area SS2 may be arranged.

The first data line DLa and a part of the first portion 200a of one of the first to nth connecting lines FL1 to FLn may be arranged in the first pixel area CA1, but the auxiliary line AL may not be arranged in the first pixel area CA1. The second data line DLb and a part of the third portion 200c of one of the first to nth connecting lines FL1 to FLn may be arranged in the second pixel area CA2, but the auxiliary line AL may not be arranged in the second pixel area CA2. In the third pixel area CA3, the first data line DLa or the second data line DLb, a part of the second portion 200b of one of the first to nth connecting lines FL1 to FLn, and the first auxiliary line ALa or the second auxiliary line ALb may be arranged. The first data line DLa and parts of the first and second portions 200a and 200b of one of the first to nth connecting lines FL1 to FLn may be arranged in the fourth pixel area CA4, but the auxiliary line AL may not be arranged in the fourth pixel area CA4.

As illustrated in FIG. 9, the second area S2 of the display area DA may include fifth pixel areas CA5. In each of the fifth pixel areas CA5, the first data line DLa or the second data line DLb, parts of the first portion 321 and the second portion 311 of the dummy line 300, and the first auxiliary line ALa or the second auxiliary line ALb may be arranged. As illustrated in FIG. 11, the auxiliary line AL may not be arranged in some of the fifth pixel areas CA5.

For example, as illustrated in FIG. 10, the length of the second auxiliary line ALb overlapping the n-th second data line DLbn may be less than the length of the first auxiliary line ALa overlapping the n-th first data line DLan. Accordingly, the fifth pixel area CA5 in which the auxiliary line AL is not arranged may be present in the second area S2. Although the nth connecting line FLn has been described with reference to FIG. 11, the first auxiliary line ALa or the second auxiliary line ALb overlapping a corresponding first data line DLa or a corresponding second data line DLb of some of the first to nth connecting lines FL1 to FLn may not be present in the second area S2.

According to the embodiment described above, the display device may correct an RC deviation between a first data line and a second data line by the adjustment of the capacitances of the first data line and the second data line.

Figure 12:
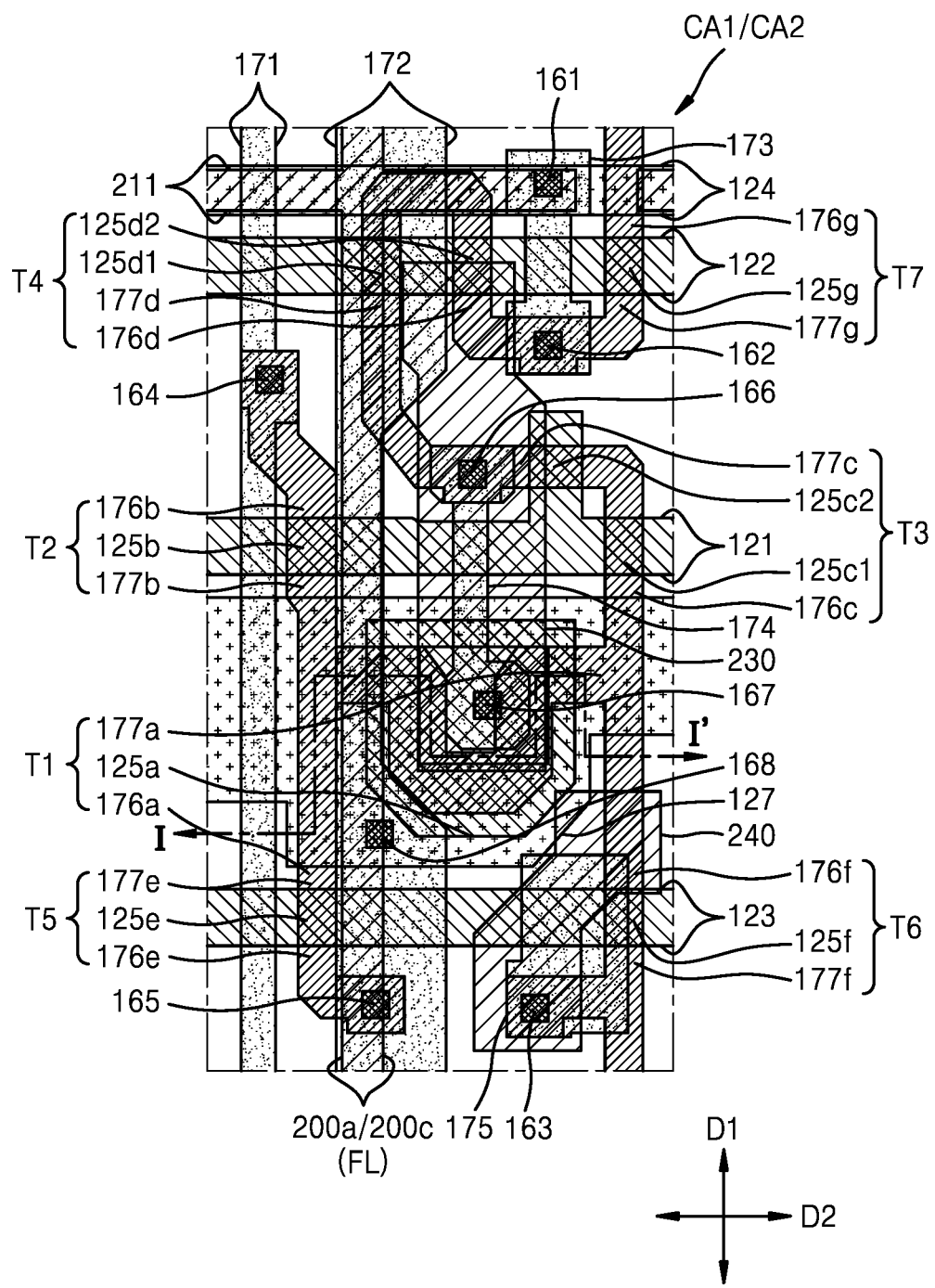
FIG. 12 is a layout view illustrating the positions of a pixel circuit, a connecting line, and the like arranged in a first pixel area or a second pixel area according to an exemplary embodiment of the inventive concept.
Figure 13:
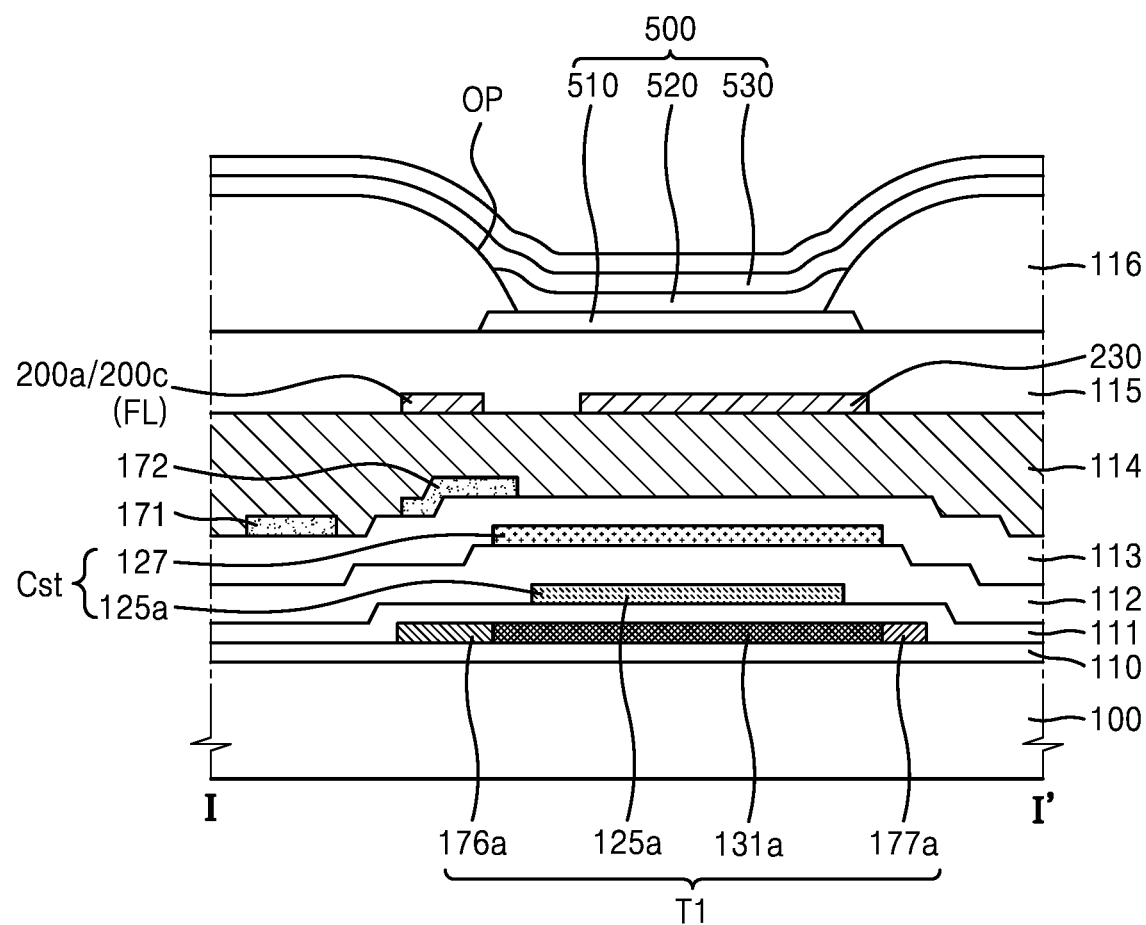
FIG. 13 is a cross-sectional view taken along line I-I' of FIG. 12.

FIG. 12 is a layout view illustrating the positions of a pixel circuit, a connecting line, and the like arranged in a first pixel area CA1 or a second pixel area CA2 according to an exemplary embodiment of the inventive concept. FIG. 13 is a cross-sectional view taken along line I-I' of FIG. 12, and the line I-I' may pass through an opening OP of FIG. 14E. FIGS. 14A to 14E are layout views illustrating elements in FIG. 12 layer by layer. In FIG. 12, the display element is omitted for convenience of illustration and description. FIG. 12 may correspond to a layout view of a pixel illustrated in FIG. 2B. The first to seventh transistors T1 to T7 illustrated in FIG. 2B may include thin film transistors.

Referring to FIGS. 12 and 13, the first pixel area CA1 may be included in the first sub-area SS1 of the display area DA, and the second pixel area CA2 may be included in the third sub-area SS3 of the display area DA. Pixels connected to the first data line DLa may be arranged in the first pixel area CA1, and pixels connected to the second data line DLb may be arranged in the second pixel area CA2.

A semiconductor layer may be located on a buffer layer 110 of the substrate 100, The substrate 100 may include various materials such as glass, metal, or plastic. According to an exemplary embodiment of the inventive concept, the substrate 100 may be a flexible substrate and may include a polymer resin such as polyethersulphone (PES), polyacrylate, polyetherimide (PEI), polyethylenenapthalate (PEN), polyethyleneterepthalate (PET), polyphenylenesulfide (PPS), polyarlylate (PAR), polyimide (PI), polycarbonate (PC), or cellulose acetate propionate (CAP). The substrate 100 may have a multilayer structure including a layer including the aforementioned polymer resin and an inorganic layer.

The buffer layer 110 may have a single layer or multilayer structure including an inorganic insulating material such as silicon oxide, silicon nitride, or silicon oxynitride. A barrier layer may be further included between the substrate 100 and the buffer layer 110 to block penetration of external air. The buffer layer 110 may be omitted.

Figure 14A:
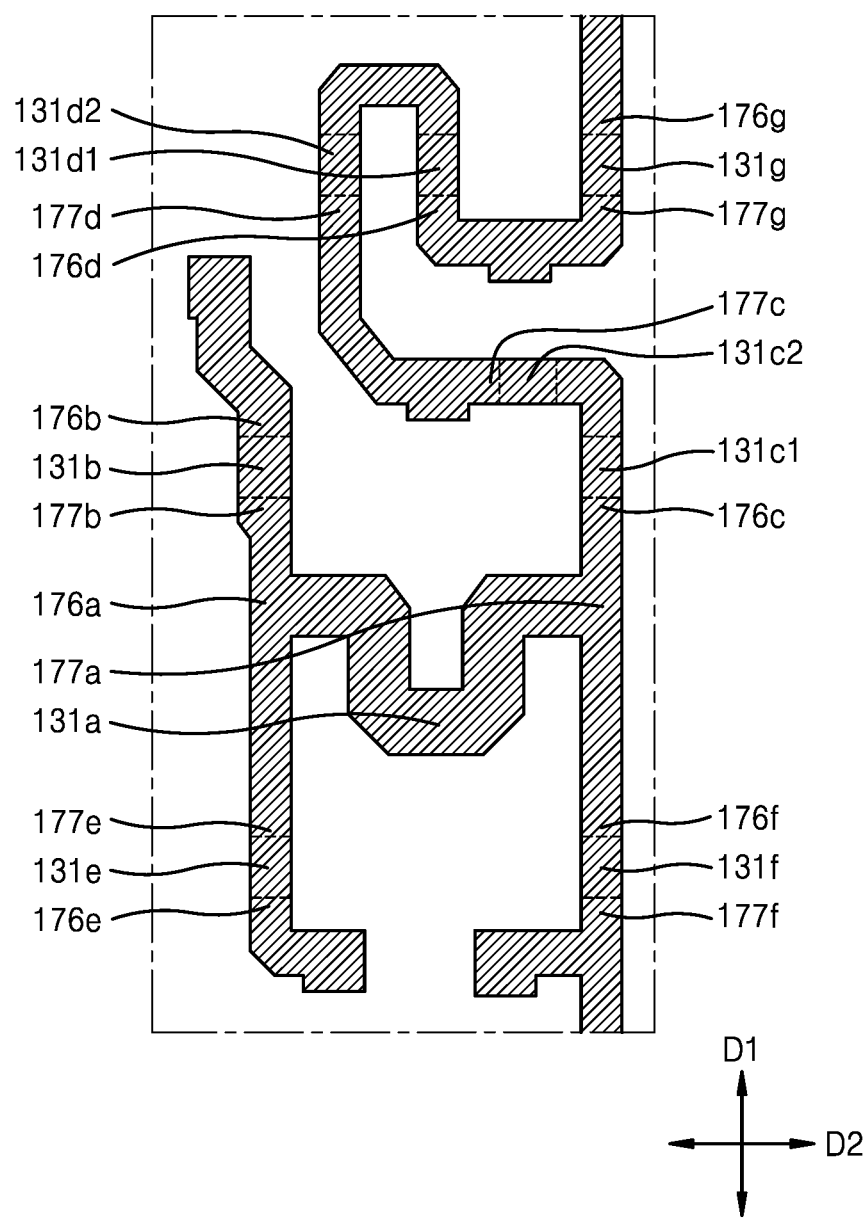
FIGS. 14A, 14B, 14C, 14D and 14E are layout views illustrating elements in FIG. 12 layer by layer.

The semiconductor layer may have a curved shape in various shapes. As illustrated in FIG. 14A, the semiconductor layer may include a channel region 131a of the first transistor T1, a channel region 131b of the second transistor T2, channel regions 131c1 and 131c2 of the third transistor T3, channel regions 131d1 and 131d2 of the fourth transistor T4, a channel region 131e of the fifth transistor T5, a channel region 131f of the sixth transistor T6, and a channel region 131g of the seventh transistor T7. In other words, the channel regions of the first to seventh transistors T1 to T7 may be portions of the semiconductor layer. The channel region 131a of the first transistor T1 may be formed long by having a bend, so that a driving range of a gate voltage applied to a gate electrode may be widened. The channel region 131a of the first transistor T1 may have various shapes such as 'Ω', 'ㄹ', 'S', 'M', and 'W'. The channel region 131g of the seventh transistor T7 may be a portion of the semiconductor layer extending from a previous row.

The semiconductor layer of the first to seventh transistors T1 to T7 may include source and drain regions on both sides of each of the channel regions. As illustrated in FIG. 14A, the semiconductor layer may include a source region 176a and a drain region 177a of the first transistor T1, a source region 176b and a drain region 177b of the second transistor T2, a source region 176c and a drain region 177c of the third transistor T3, a source region 176d and a drain region 177d of the fourth transistor 14, a source region 176e and a drain region 177e of the fifth transistor T5, a source region 176f and a drain region 177f of the sixth transistor T6, and a source region 176g and a drain region 177g of the seventh transistor T7. The source regions or drain regions may correspond to source electrodes or drain electrodes of transistors. For example, the source electrode and the drain electrode of the first transistor T1 may respectively correspond to the source region 176a and the drain region 177a doped with impurities in the vicinity of the channel region 131a in the semiconductor layer illustrated in FIG. 14A. In some exemplary embodiments of the inventive concept, positions of the source region and the drain region may be changed. A first insulating layer 111 may be located on the semiconductor layer.

Figure 14B:
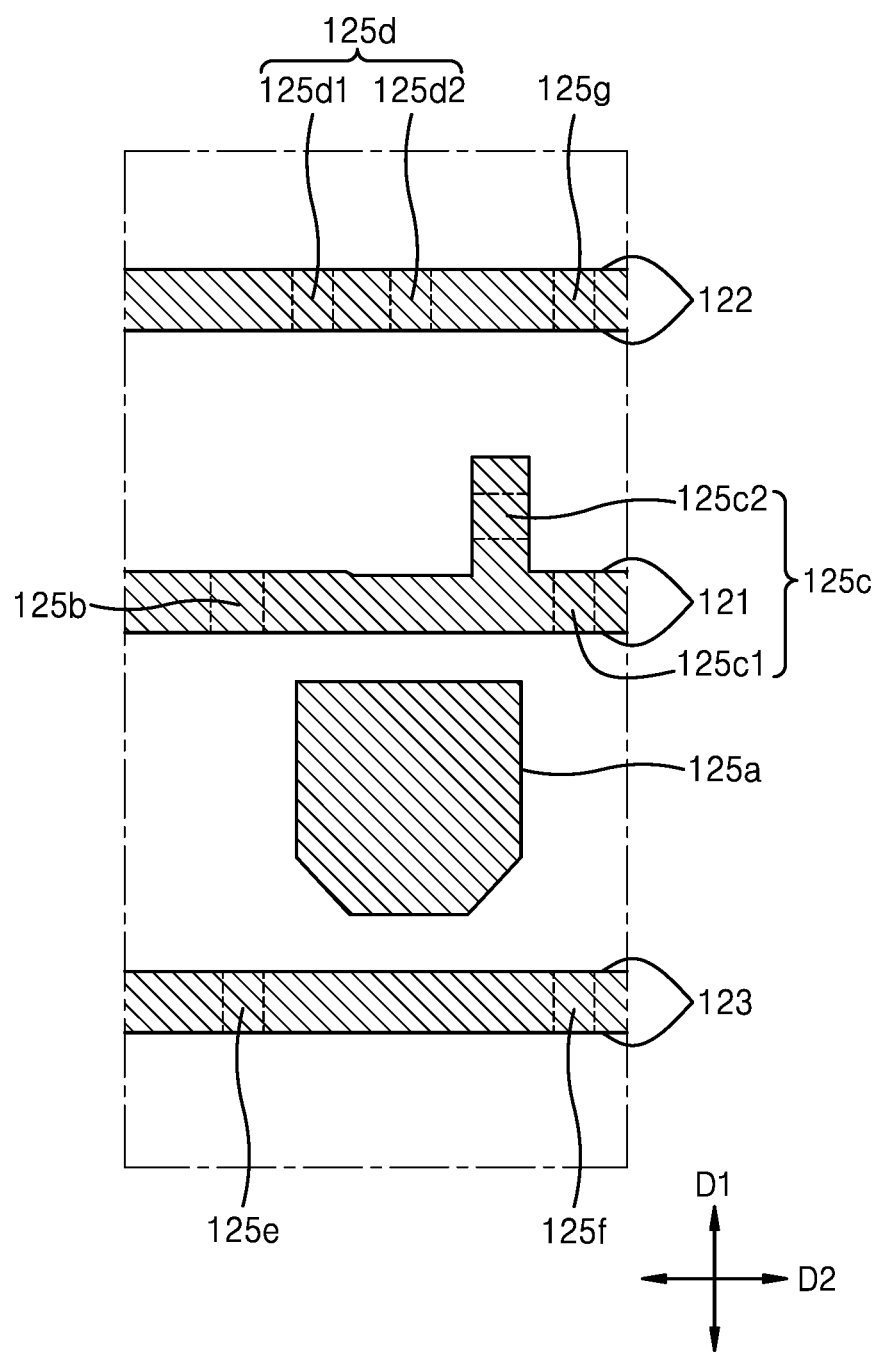

As illustrated in FIG. 14B, a gate electrode 125a of the first transistor T1, a gate electrode 125b of the second transistor T2, gate electrodes 125c1 and 125c2 of the third transistor T3, gate electrodes 125d1 and 125d2 of the fourth transistor T4, a gate electrode 125e of the fifth transistor 15, a gate electrode 125f of the sixth transistor T6, and a gate electrode 125g of the seventh transistor T7 may be arranged on the first insulating layer 111. In addition, a first scan line 121, a second scan line 122, and an emission control line 123, which include the same material and are disposed on the same layer as the gate electrodes of the first to seventh transistors T1 to T7, may extend in the second direction D2 and be arranged on the first insulating layer 111. The gate electrode 125a of the first transistor T1 may also function as a lower electrode of the capacitor Cst.

The gate electrode 125b of the second transistor T2 and the gate electrodes 125c1 and 125c2 of the third transistor T3 may be portions of the first scan line 121 intersecting the semiconductor layer or portions protruding from the first scan line 121. The gate electrodes 125d1 and 125d2 of the fourth transistor T4 and the gate electrode 125g of the seventh transistor T7 may be portions of the second scan line 122 intersecting the semiconductor layer or portions protruding from the second scan line 122. The gate electrode 125e of the fifth transistor T5 and the gate electrode 125f of the sixth transistor T6 may be portions of the emission control line 123 intersecting the semiconductor layer or portions protruding from the emission control line 123. The electrode 125a of the first transistor T1 may an island. The gate electrode 125a of the first transistor T1 may be a lower electrode of the capacitor Cst. A second insulating layer 112 may be arranged on the gate electrodes of the first to seventh transistors T1 to T7.

Figure 14C:
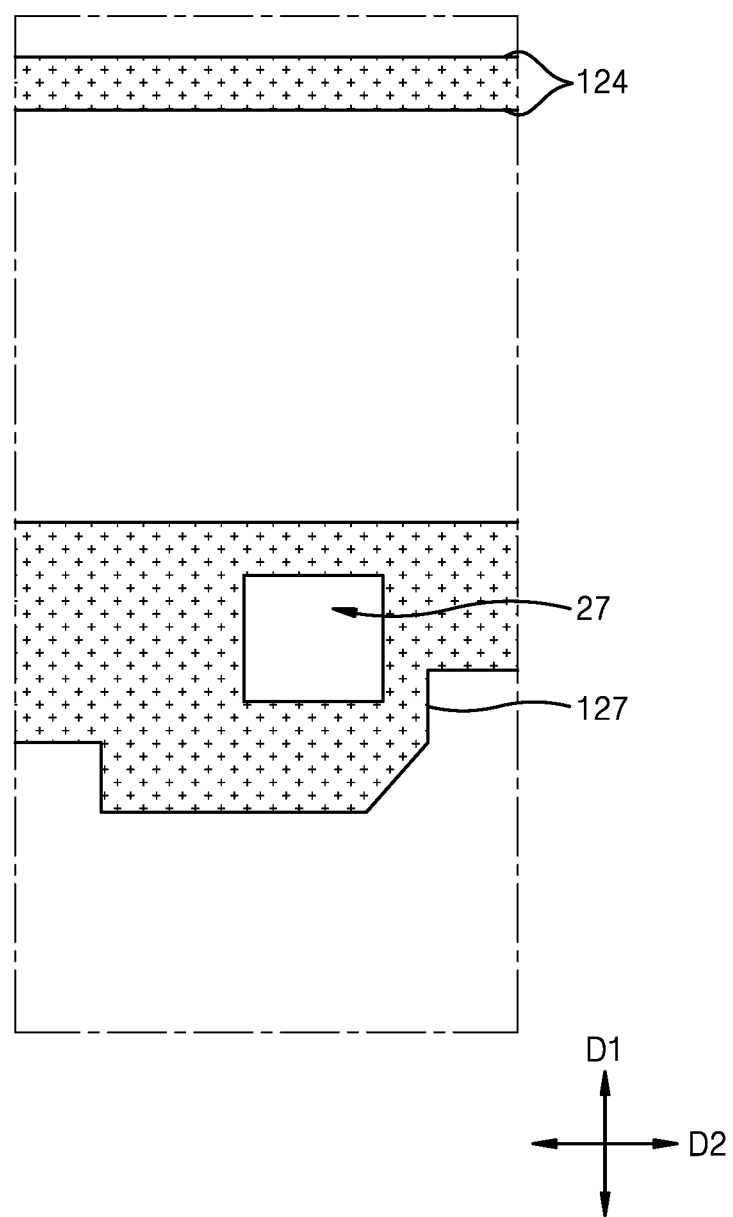

As illustrated in FIG. 14C, an upper electrode 127 of the capacitor Cst may be arranged on the second insulating layer 112. An opening 27 may be formed in the upper electrode 127 of the capacitor Cst. A node electrode 174 may allow the lower electrode (e.g., the gate electrode 125a) of the capacitor Cst and the drain region 177c of the third transistor T3 to be electrically connected to each other through the opening 27.

An initialization voltage line 124 may be arranged, on the second insulating layer 112, and disposed on the same layer as the upper electrode 127 of the capacitor Cst. The initialization voltage line 124 may extend in the second direction D2. A third insulating layer 113 may be arranged on the upper electrode 127 of the capacitor Cst.

The first insulating layer 111, the second insulating layer 112, and the third insulating layer 113 may be inorganic insulating layers including an inorganic material such as silicon oxide, silicon nitride, and/or silicon oxynitride.

Figure 14D:
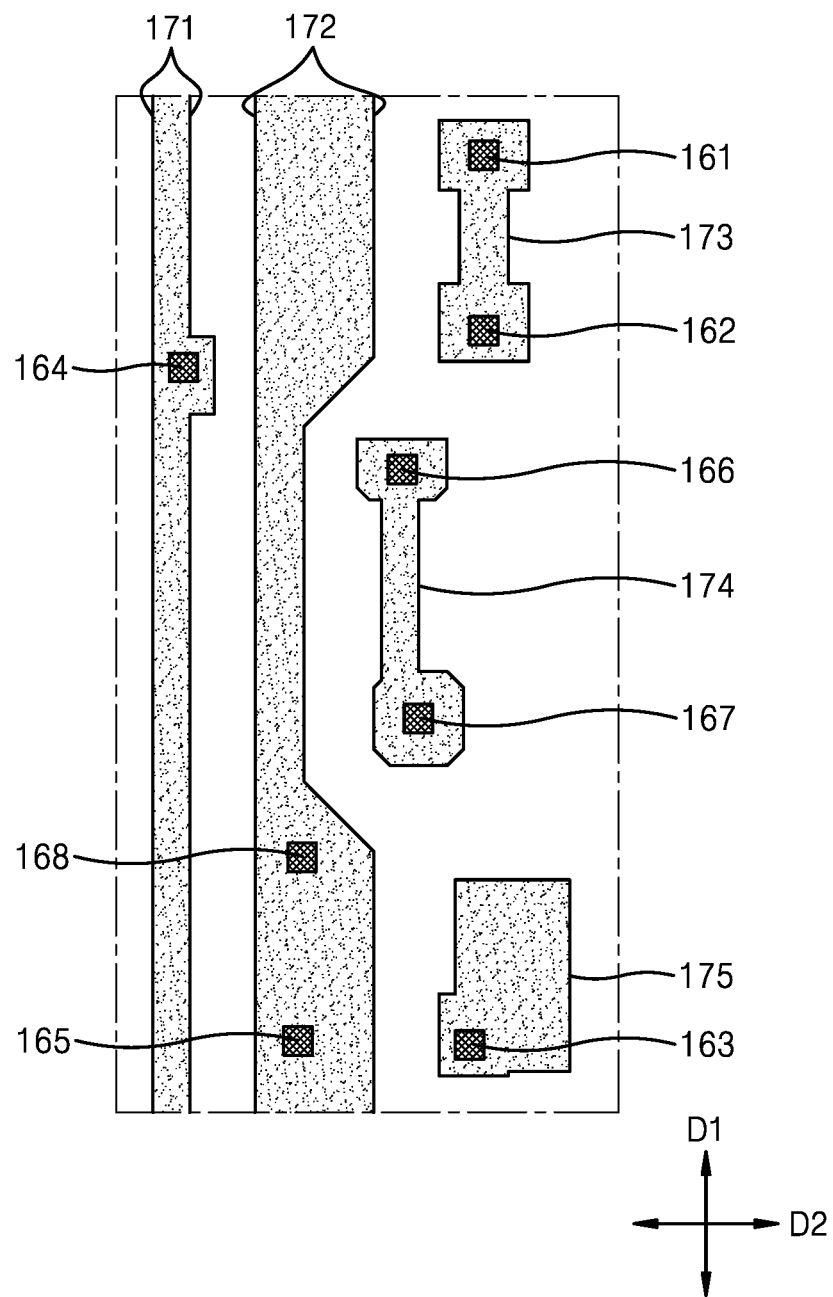

As illustrated in FIG. 14D, a data line 171 and a power voltage line 172 may be arranged on the third insulating layer 113. The data line 171 may be a first data line DLa in the first pixel area CA1 and a second data line DLb in the second pixel area CA2. The data line 171 may be connected to the source region 176b of the second transistor T2 through a contact hole 164 formed in the first insulating layer 111, the second insulating layer 112, and the third insulating layer 113. The power voltage line 172 may be connected to the upper electrode 127 of the capacitor Cst through a contact hole 168 formed in the third insulating layer 113 and may be connected to the source region 176e of the fifth transistor T5 through a contact hole 165 formed in the first insulating layer 111, the second insulating layer 112, and the third insulating layer 113. As the power voltage line 172 extending in the first direction D1 is connected to the upper electrode 127 of the capacitor Cst extending in the second direction D2, the power voltage line 172 may have a mesh structure.

Each of the data line 171 and the power voltage line 172 may include molybdenum (Mo), aluminum (Al), copper (Cu), titanium (Ti), and the like and may include multiple layers or a single layer. In an exemplary embodiment of the inventive concept, each of the data line 171 and the power voltage line 172 may have a multilayer structure of Ti/Al/Ti.

Various conductive layers may be further arranged on the third insulating layer 113. For example, a node electrode 174 and connection members 173 and 175 may be formed on the third insulating layer 113. A first end of the node electrode 174 may be connected to the drain region 177c of the third transistor T3 and the drain region 177d of the fourth transistor T4 through a contact hole 166 formed in the first insulating layer 111, the second insulating layer 112, and the third insulating layer 113, and a second end of the node electrode 174 may be connected to the gate electrode 125a of the first transistor T1 through a contact hole 167 formed in the second insulating layer 112 and the third insulating layer 113. In this case, the second end of the node electrode 174 may be connected to the gate electrode 125a of the first transistor T1 through an opening 27 formed in the upper electrode 127 of the capacitor Cst. A first end of the connection member 173 may be connected to the initialization voltage line 124 through a contact hole 161 formed in the third insulating layer 113, and a second end of the connection member 173 may be connected to the source region 176d of the fourth transistor T4 through a contact hole 162 formed in the first insulating layer 111, the second insulating layer 112, and the third insulating layer 113. The connection member 175 may be connected to the drain region 177f of the sixth transistor T6 through a contact hole 163 formed in the first insulating layer 111, the second insulating layer 112, and the third insulating layer 113. The connection member 175 may be electrically connected to a pixel electrode. A connection member may be further provided on a fourth insulating layer 114 between the connection member 175 and a pixel electrode 510 to electrically connect the connection member 175 to the pixel electrode 510.

Figure 14E:
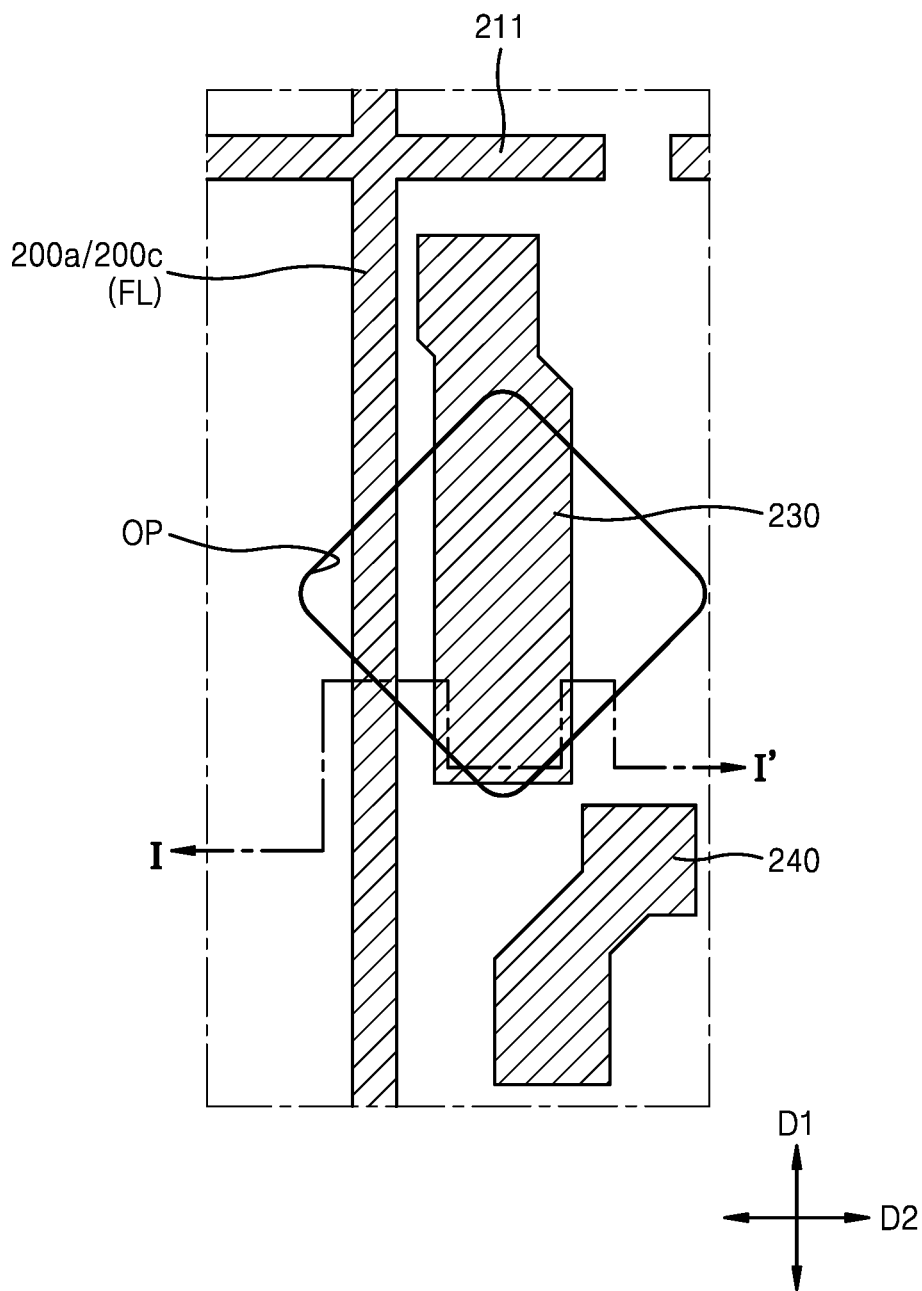

The fourth insulating layer 114 may be arranged on the data line 171 and the power voltage line 172. As illustrated in FIG. 14E, a connecting line FL and first and second dummy patterns 230 and 240 may be provided on the fourth insulating layer 114. A first portion 200a of the connecting line FL and the first and second dummy patterns 230 and 240 may be provided in the first pixel area CA1. A third portion 200c of the connecting line FL and the first and second dummy patterns 230 and 240 may be provided in the second pixel area CA2. The first portion 200a or the third portion 200c of the connecting line FL may extend in the first direction D1 and may overlap the power voltage line 172. The fourth insulating layer 114 may be disposed between the power voltage line and the first portion 200a or the third portion 200c of the connecting line FL. A first branch 211 of the connecting line FL may extend in the second direction D2 and may overlap the initialization voltage line 124. The first dummy pattern 230 may overlap the node electrode 174, and the second dummy pattern 240 may overlap the connection member 175, A fifth insulating layer 115 may be located on the connecting line FL and the first and second dummy patterns 230 and 240.

Each of the connecting line FL and the first and second dummy patterns 230 and 240 may include Mo, Al, Cu, Ti, and the like and may include multiple layers or a single layer. In an exemplary embodiment of the inventive concept, each of the connecting line FL and the first and second dummy patterns 230 and 240 may have a multilayer structure of Ti/Al/Ti.

The fourth insulating layer 114 and the fifth insulating layer 115 may be organic insulating layers as planarization insulating layers. Each of the fourth insulating layer 114 and the fifth insulating layer 115 may include an organic insulation material such as polymethyl methacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and a blend thereof. In an exemplary embodiment of the inventive concept, the fourth insulating layer 114 and the fifth insulating layer 115 may include polyimide.

A display element 500 may be arranged on the fifth insulating layer 115. The display element 500 may include a pixel electrode 510, an intermediate layer 520, and an opposite electrode 530.

The pixel electrode 510 may be arranged on the fifth insulating layer 115 and may be connected to the sixth transistor T6 through the connection member on the fourth insulating layer 114 and the connection member 175 on the third insulating layer 113. The pixel electrode 510 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another exemplary embodiment of the inventive concept, the pixel electrode 510 may include a reflective layer including Ag, Mg, Al, Pt, Pd, Au, Ni, Nd, Ir, Cr, or a compound thereof. In another exemplary embodiment of the inventive concept, the pixel electrode 510 may further include a film including ITO, IZO, ZnO, or $In_2O_3$ above/below the reflective layer.

A sixth insulating layer 116 may be arranged on the fifth insulating layer 115. As illustrated in FIG. 14E, the sixth insulating layer 116 may have an opening corresponding to each pixel, in other words, an opening OP exposing a portion of the pixel electrode 510, and thus may function as a pixel-defining layer that defines a pixel. The sixth insulating layer 116 may include an organic material, such as polyimide (PI) or hexamethyldisiloxane (HMDSO).

The intermediate layer 520 includes an emission layer. The emission layer may include a polymer or low-molecular weight organic material emitting light having a certain color. In an exemplary embodiment of the inventive concept, the intermediate layer 520 may include a first functional layer under the emission layer and/or a second functional layer on the emission layer. The first functional layer and/or the second functional layer may include an integral layer over a plurality of pixel electrodes 510 or may include a layer patterned to correspond to each of the plurality of pixel electrodes 510.

The first functional layer may have a single-layer or multilayer structure. For example, when the first functional layer includes a polymer material, the first functional layer may be a hole transport layer (HTL) having a single-layer structure and may include poly-(3,4)-ethylene-dihydroxy thiophene (PEDOT) or polyaniline (PANT). When the first functional layer includes a low-molecular weight material, the first functional layer may include a hole injection layer (HIL) and an HTL.

The second functional layer may not be provided. When the first functional layer and the emission layer include a polymer material, the second functional layer may be formed to make characteristics of an organic light-emitting diode better. The second functional layer may have a single-layer or multilayer structure. The second functional layer may include an electron transport layer (ETL) and/or an electron injection layer (EIL).

The opposite electrode 530 faces the pixel electrode 510 with the intermediate layer 520 therebetween. The opposite electrode 530 may include a conductive material having a low work function. For example, the opposite electrode 530 may include a (semi)transparent layer including silver (Ag), magnesium (Mg), aluminum (Al), platinum (Pt), palladium (pd), gold (Au), nickel (Ni), neodymium (Nd), iridium (Ir), chromium (Cr), lithium (Li), calcium (Ca), or an alloy thereof. Alternatively, the opposite electrode 530 may further include a layer, which includes a material such as ITO, IZO, ZnO, or $In_2O_3$, on the (semi)transparent layer including the above-described material. The opposite electrode 530 may be arranged on the intermediate layer 520 and the sixth insulating layer 116. The opposite electrode 530 may be integrally formed in a plurality of display elements 500 in the display area DA and face the plurality of pixel electrodes 510.

Figure 15:
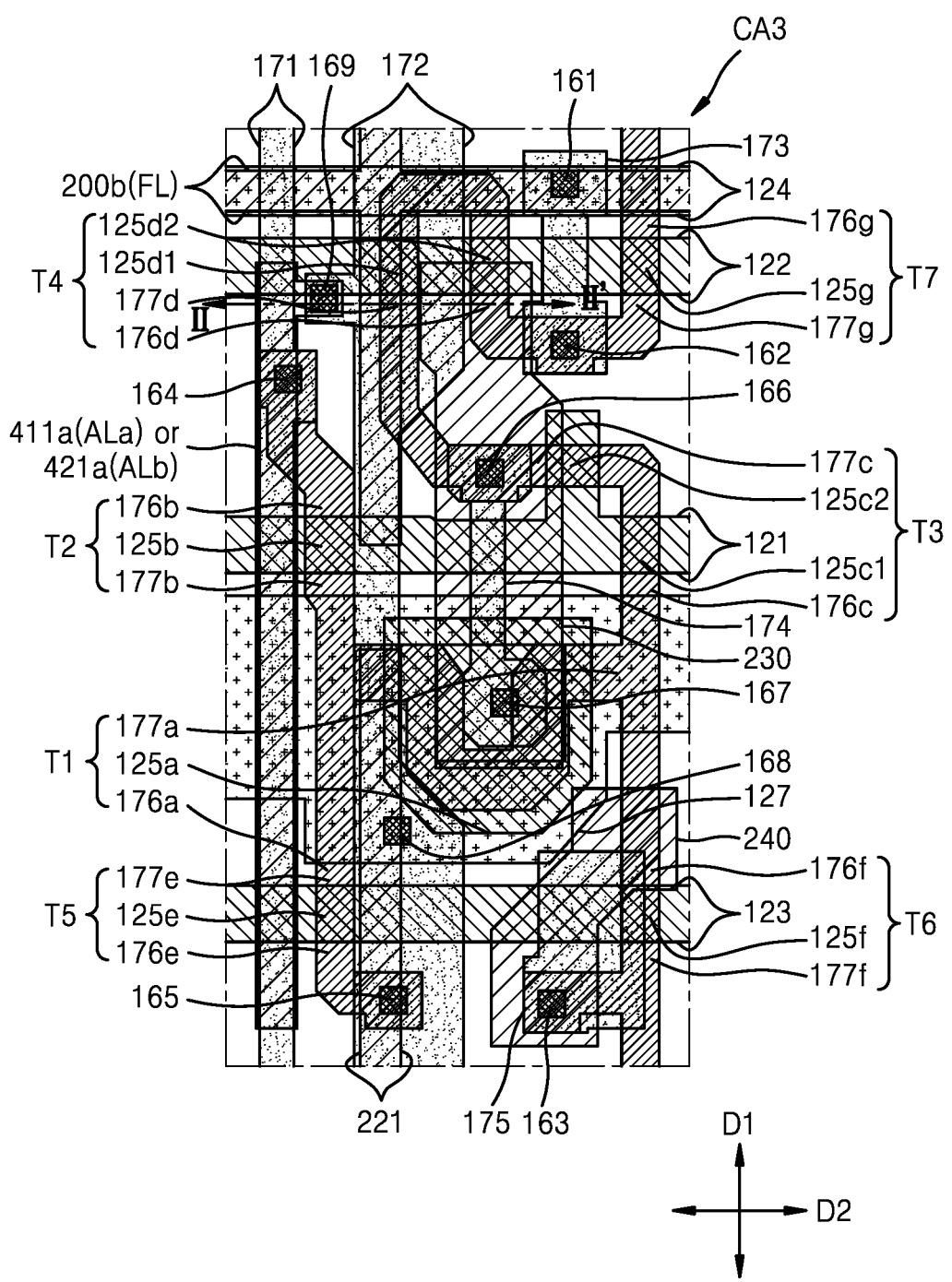
FIG. 15 is a layout view illustrating the positions of a pixel circuit, a connecting line, and the like arranged in a third pixel area according to an exemplary embodiment of the inventive concept.
Figure 16:
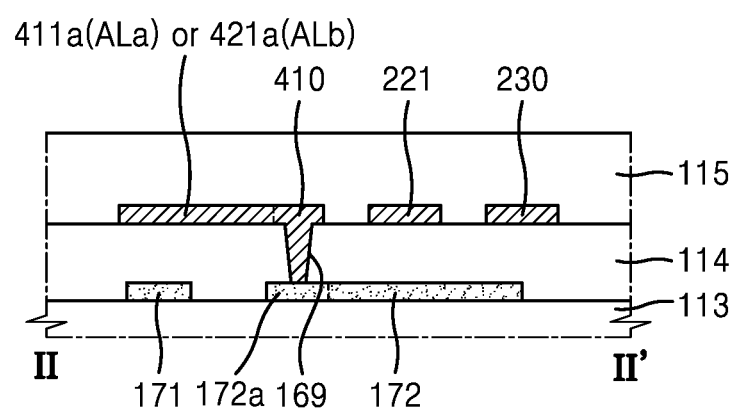
FIG. 16 illustrates a portion of a cross-section taken along line of FIG. 15.
Figure 17A:
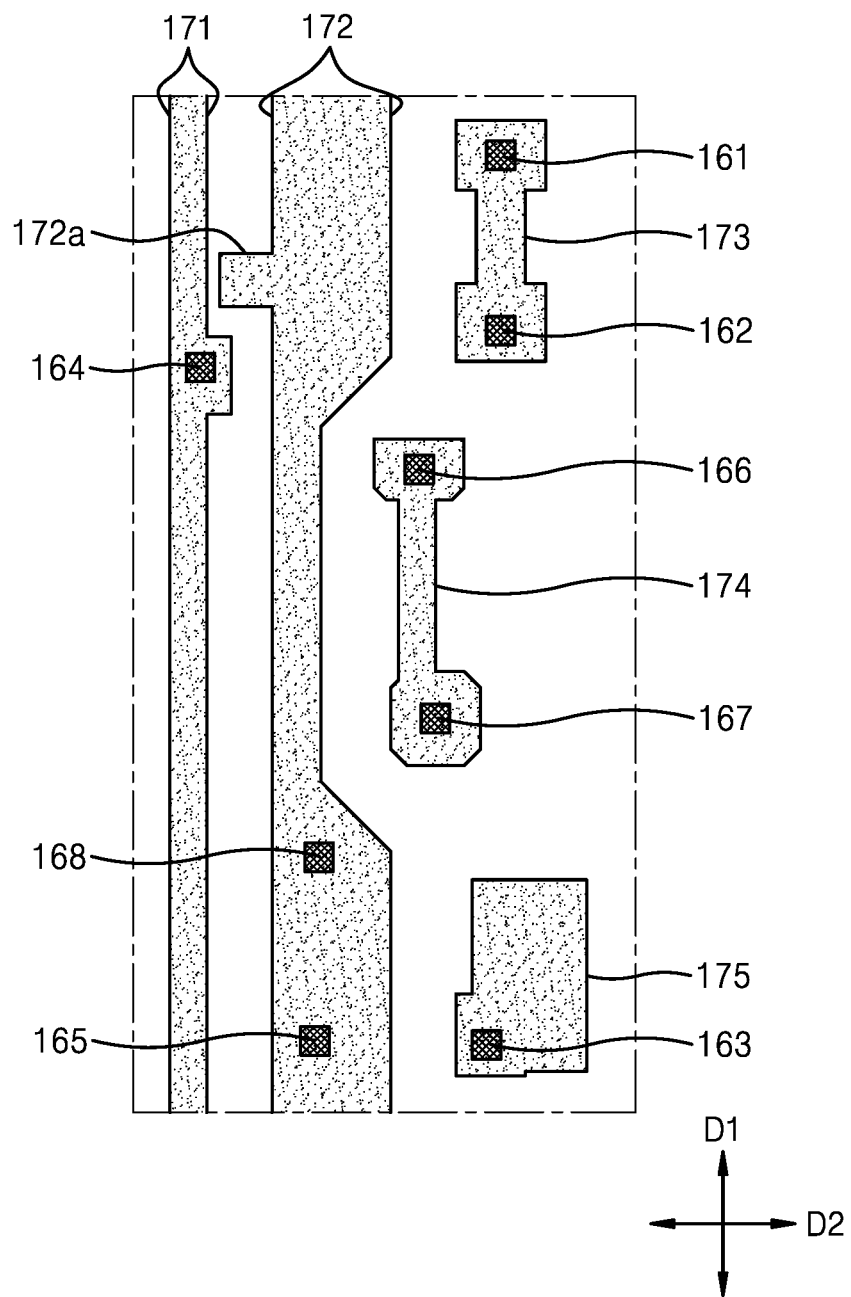
FIGS. 17A and 17B are layout views illustrating some elements in FIG. 15 layer by layer.
Figure 17B:
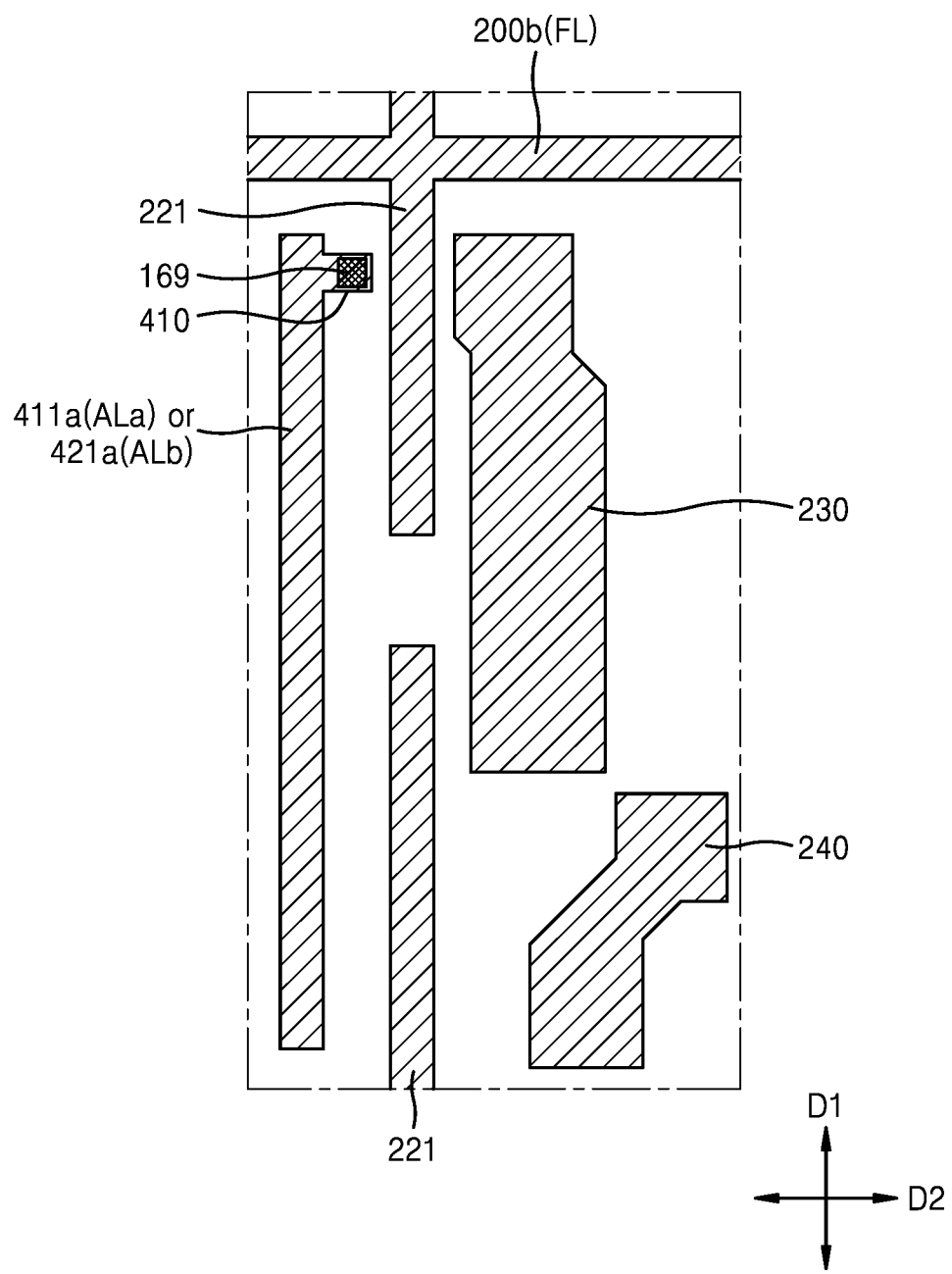

FIG. 15 is a layout view illustrating the positions of a pixel circuit, a connecting line, and the like arranged in a third pixel area CA3 according to an exemplary embodiment of the inventive concept. FIG. 16 illustrates a portion of a cross-section taken along line of FIG. 15. FIGS. 17A and 17B are layout views illustrating some elements in FIG. 15 layer by layer. Hereinafter, descriptions that are the same as those given with reference to FIG. 12 may be omitted.

The third pixel area CA3 may be included in the second sub-area SS2 of the display area DA. Pixels connected to the first data line DLa or the second data line DLb may be arranged in the third pixel area CA3. A data line 171 illustrated in FIG. 15 may be the first data line DLa or the second data line DLb. Like that illustrated in FIGS. 14A to 14C, transistors (T1-T7) and a capacitor (Cst) may be arranged in the third pixel area CA3, and the third insulating layer 113 may cover the transistors (T1-T7) and the capacitor (Cst).

Referring to FIGS. 15 and 16, the data line 171 and a power voltage line 172 may be arranged on the third insulating layer 113 in the third pixel area CA3. As illustrated in FIG. 17A, the power voltage line 172 may include a protrusion 172a protruding toward the data line 171. The fourth insulating layer 114 may be arranged on the data line 171 and the power voltage line 172.

As illustrated in FIG. 17B, a connecting line FL and first and second dummy patterns 230 and 240 may be provided on the fourth insulating layer 114. The fifth insulating layer 115 may be located on the connecting line FL and the first and second dummy patterns 230 and 240. A second portion 200b of the connecting line FL may extend in the second direction D2 and may overlap an initialization voltage line 124. A second branch 221 of the connecting line FL may extend in the first direction D1 and may overlap the power voltage line 172. The second branch 221 may be disposed between the first dummy pattern 230 and an auxiliary line (ALa or ALb). The first dummy pattern 230 may overlap a node electrode 174, and the second dummy pattern 240 may overlap a connection member 175.

As illustrated in FIG. 17B, a first auxiliary line ALa or a second auxiliary line ALb may be further arranged on the fourth insulating layer 114. A first portion 411a of the first auxiliary line ALa or a first portion 421a of the second auxiliary line ALb may be arranged in the third pixel area CA3. The first portion 411a of the first auxiliary line ALa or the first portion 421a of the second auxiliary line ALb may extend in the first direction D1, be parallel to the second branch 221 of the connecting line FL, and overlap the data line 171. The first portion 411a of the first auxiliary line ALa or the first portion 421a of the second auxiliary line ALb may include a protrusion 410 protruding toward the second branch 221. The protrusion 410 may extend in the second direction D2. The first portion 411a of the first auxiliary line ALa or the first portion 421a of the second auxiliary line ALb may be connected to the power voltage line 172 through a contact hole 169 formed in the fourth insulating layer 114. The protrusion 410 of the first portion 411a of the first auxiliary line ALa or the first portion 421a of the second auxiliary line ALb may overlap a protrusion 172a of the power voltage line 172 and be electrically connected to the power voltage line 172.

The first auxiliary line ALa and the second auxiliary line ALb may include the same material as the connecting line FL. Each of the first auxiliary line ALa and the second auxiliary line ALb may include Mo, Al, Cu, Ti, and the like and may include multiple layers or a single layer. In an exemplary embodiment of the inventive concept, each of the first auxiliary line ALa and the second auxiliary line ALb may have a multilayer structure of Ti/Al/Ti.

Figure 18:
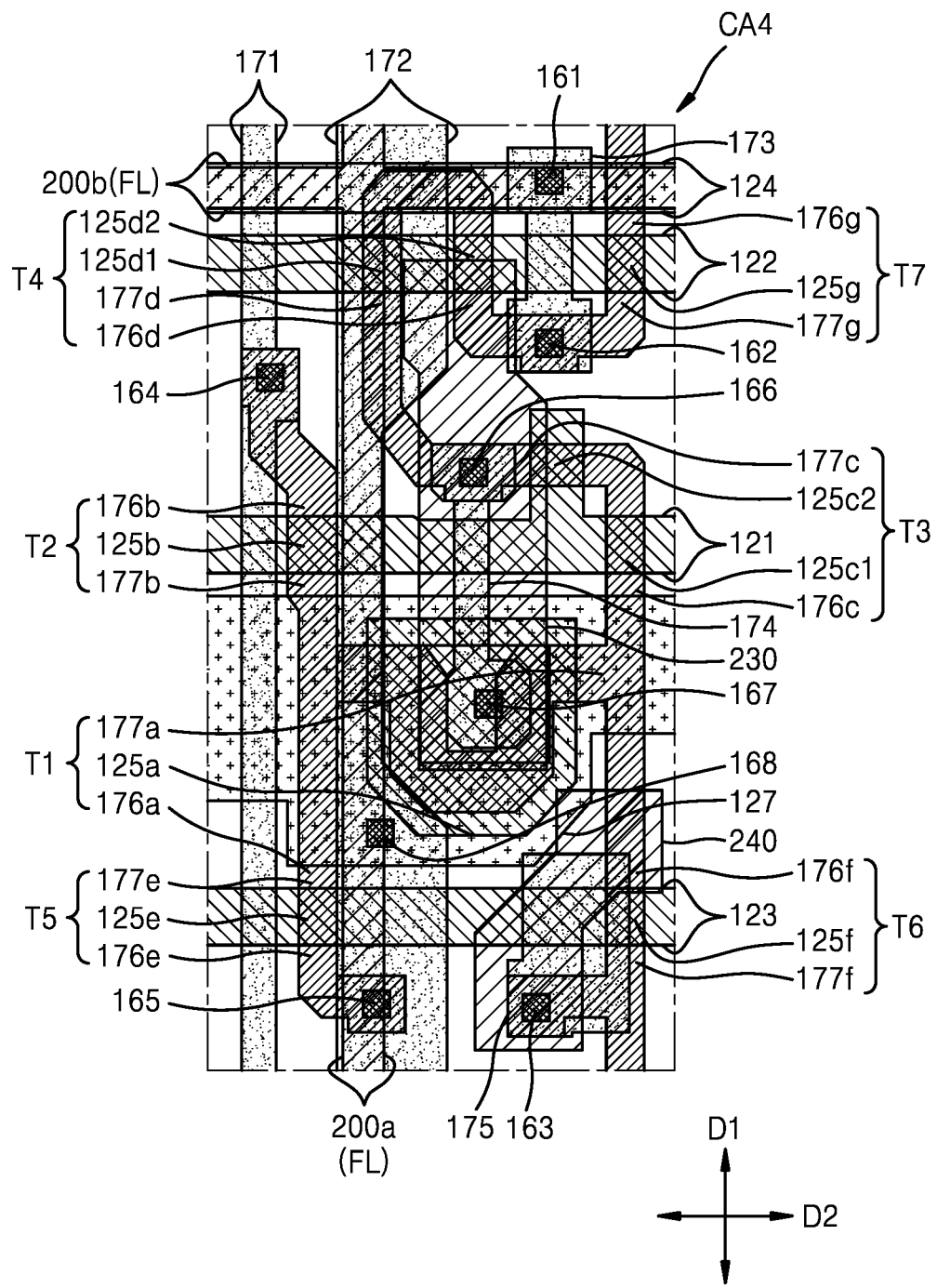
FIG. 18 is a layout view illustrating the positions of a pixel circuit, a connecting line, and the like arranged in a fourth pixel area according to an exemplary embodiment of the inventive concept.

FIG. 18 is a layout view illustrating the positions of a pixel circuit, a connecting line, and the like arranged in a fourth pixel area CA4 according to an exemplary embodiment of the inventive concept.

The fourth pixel area CA4 may be included at the boundary between the first sub-area SS1 and the second sub-area SS2 of the display area DA. Pixels connected to the first data line DLa may be arranged in the fourth pixel area CA4. A data line 171 illustrated in FIG. 18 may be the first data line DLa.

As illustrated in FIG. 18, a first portion 200a and a second portion 200b of a connecting line FL may be arranged on the fourth insulating layer 114 in the fourth pixel area CA4. The first portion 200a of the connecting line FL may extend in the first direction D1 and may overlap a power voltage line 172. The second portion 200b of the connecting line FL may extend in the second direction D2 and may overlap an initialization voltage line 124. A first dummy pattern 230 may overlap a node electrode 174, and a second dummy pattern 240 may overlap a connection member 175. Elements other than the connecting line FL are the same as those illustrated in FIG. 12, and thus detailed descriptions thereof have been omitted.

Figure 19:
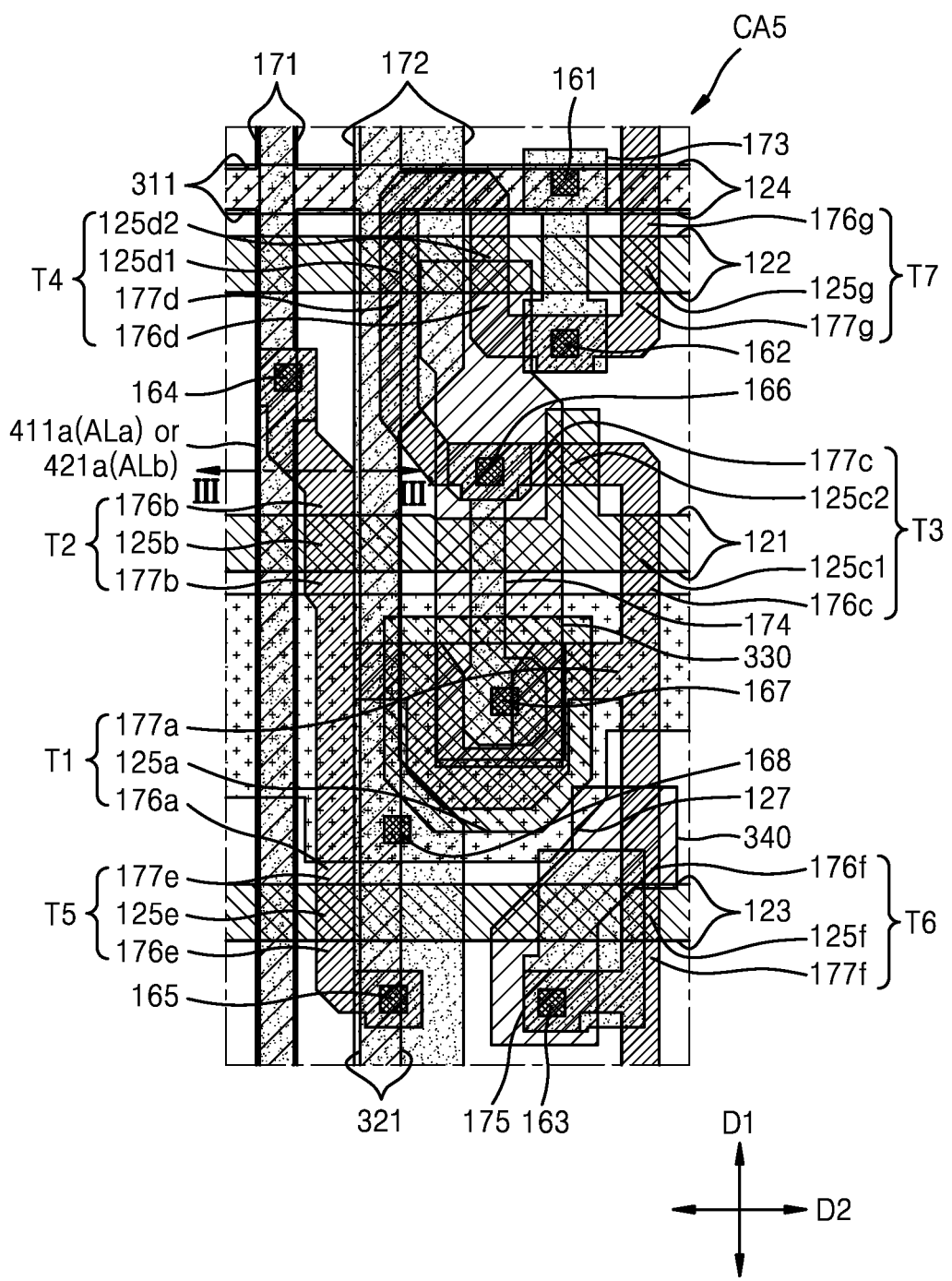
FIGS. 19 and 22 are layout views illustrating the positions of a pixel circuit, a connecting line, and the like arranged in a fifth pixel area according to an exemplary embodiment of the inventive concept.
Figure 20:
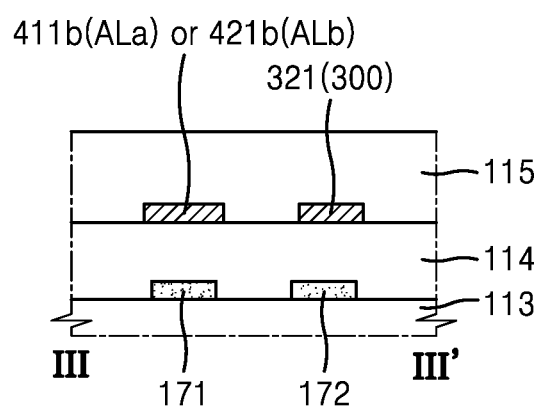
FIG. 20 is a cross-sectional view taken along line III-III' of FIG. 19.
Figure 21:
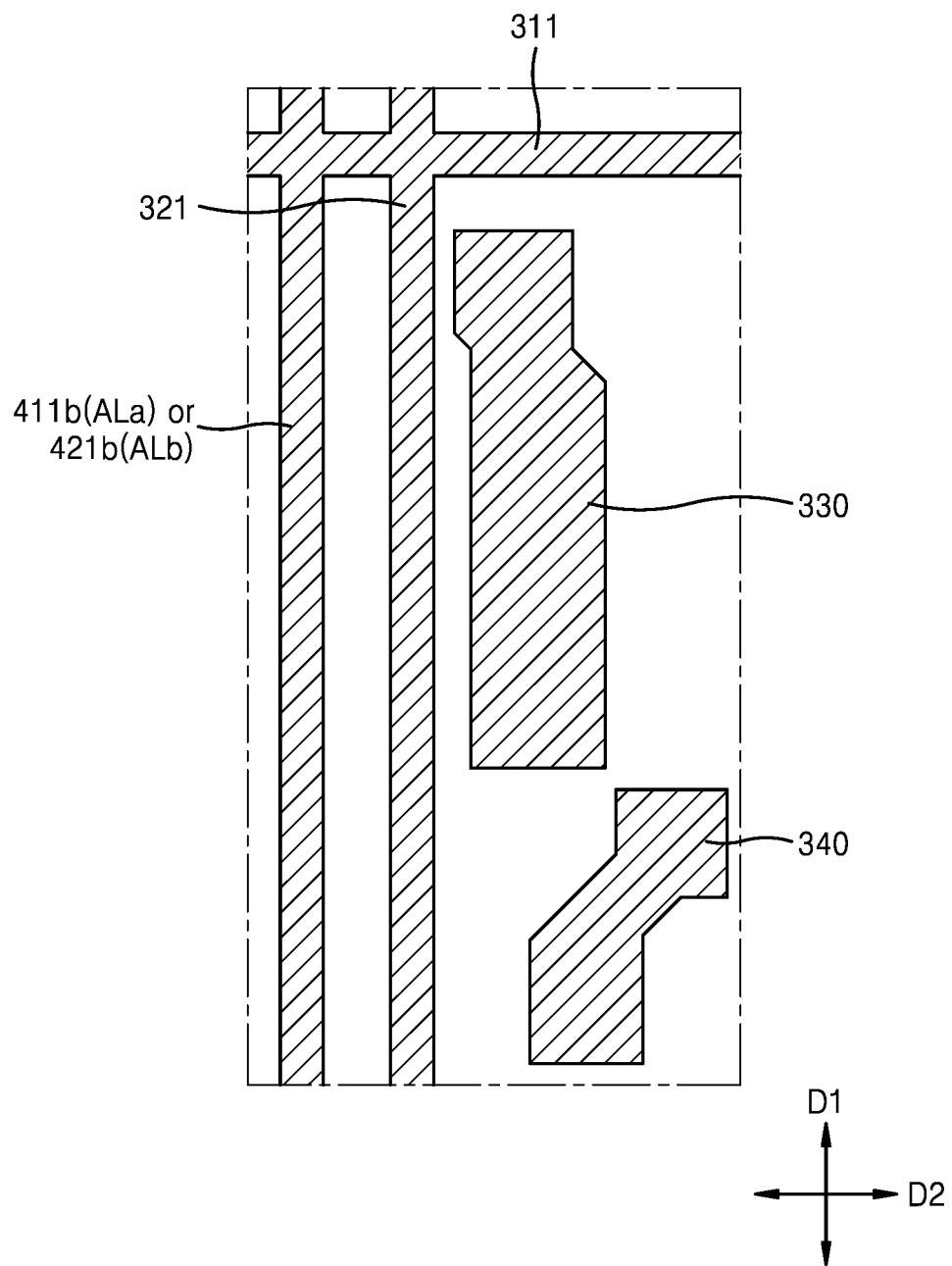
FIG. 21 is a layout view illustrating some elements in FIG. 19.
Figure 22:
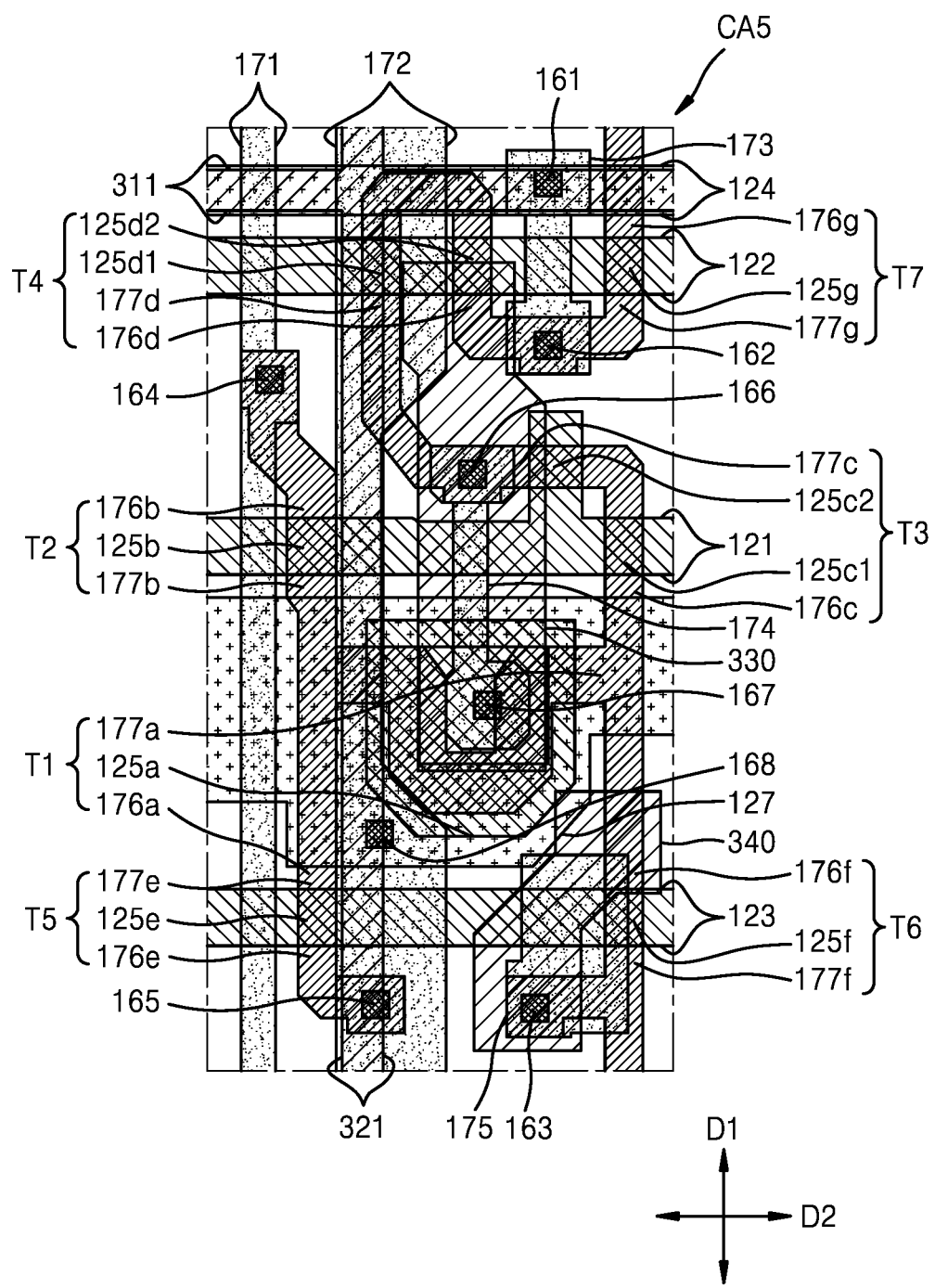

FIGS. 19 and 22 are layout views illustrating the positions of a pixel circuit, a connecting line, and the like arranged in a fifth pixel area CA5 according to an exemplary embodiment of the inventive concept. FIG. 20 is a cross-sectional view taken along line of FIG. 19. FIG. 21 is a layout view illustrating some elements in FIG. 19.

The fifth pixel area CA5 may be included in the second area S2 of the display area DA. Pixels connected to the first data line DLa or the second data line DLb may be arranged in the fifth pixel area CA5. A data line 171 illustrated in FIG. 19 may be the first data line DLa or the second data line DLb. Like that illustrated in FIGS. 14A to 14C, transistors (T1-T7) and a capacitor (Cst) may be arranged in the fifth pixel area CA5, and the third insulating layer 113 may cover the transistors (T1-T7) and the capacitor (Cst).

Referring to FIGS. 19 to 21, the data line 171 and a power voltage line 172 may be arranged on the third insulating layer 113 in the fifth pixel area CA5. The fourth insulating layer 114 may be arranged on the data line 171 and the power voltage line 172. A first portion 321 and a second portion 311 of a dummy line 300 may be located on the fourth insulating layer 114. The first portion 321 of the dummy line 300 may extend in the first direction D1 and may overlap the power voltage line 172. The second portion 311 of the dummy line 300 may extend in the second direction D2 and may overlap an initialization voltage line 124. The second portion 311 of the dummy line 300 and the first portion 321 of the dummy line 300 may intersect each other. A third dummy pattern 330 may overlap a node electrode 174, and a second dummy pattern 340 may overlap a connection member 175. The dummy line 300 may be electrically connected to the power voltage line 172 through a contact hole formed in the fourth insulating layer 114. In the fifth pixel area CA5, the position of the contact hole electrically connecting the dummy line 300 to the power voltage line 172 may be any position where the dummy line 300 and the power voltage line 172 overlap each other.

As illustrated in FIG. 21, a first auxiliary line ALa or a second auxiliary line ALb may be further arranged, on the fourth insulating layer 114, in parallel with the first portion 321 of the dummy line 300. A second portion 411b of the first auxiliary line ALa or a second portion 421b of the second auxiliary line ALb may be arranged in the fifth pixel area CA5. The first auxiliary line ALa and the second auxiliary line ALb may be integrally formed with the dummy line 300. Accordingly, the first auxiliary line ALa and the second auxiliary line ALb may be in a floating state, or a first power voltage ELVDD may be applied thereto. The second portion 411b of the first auxiliary line ALa or the second portion 421b of the second auxiliary line ALb may extend in the first direction D1 and overlap the data line 171. Elements other than the dummy line 300 and the first and second auxiliary lines ALa and ALb are the same as those illustrated in FIG. 12, and thus detailed descriptions thereof have been omitted. In some of the fifth pixel areas CA5, the first and second auxiliary lines ALa and ALb may not be arranged.

Figure 23:
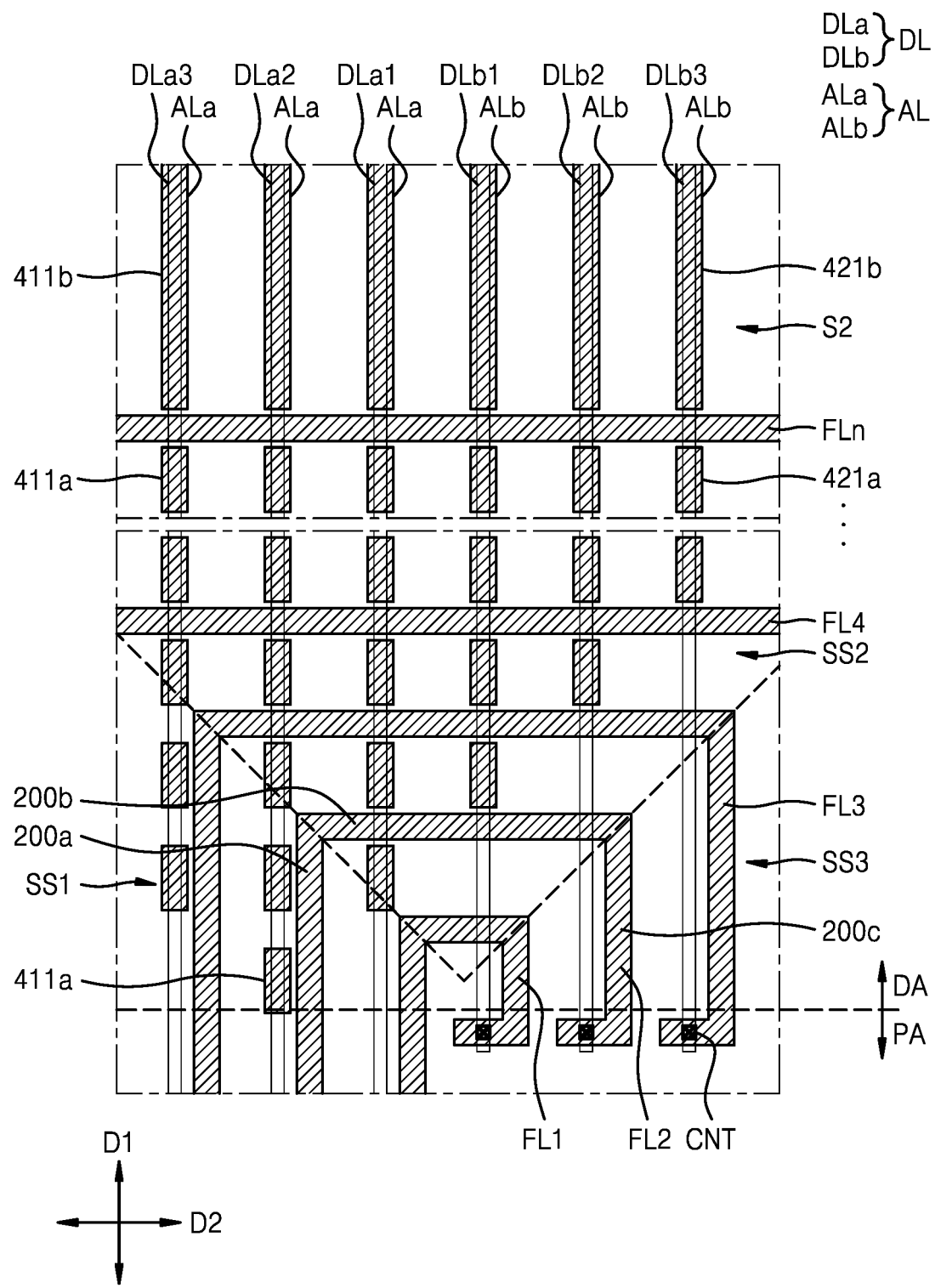
FIG. 23 is a view illustrating the arrangement of wires of a display device according to another exemplary embodiment of the inventive concept.
Figure 24:
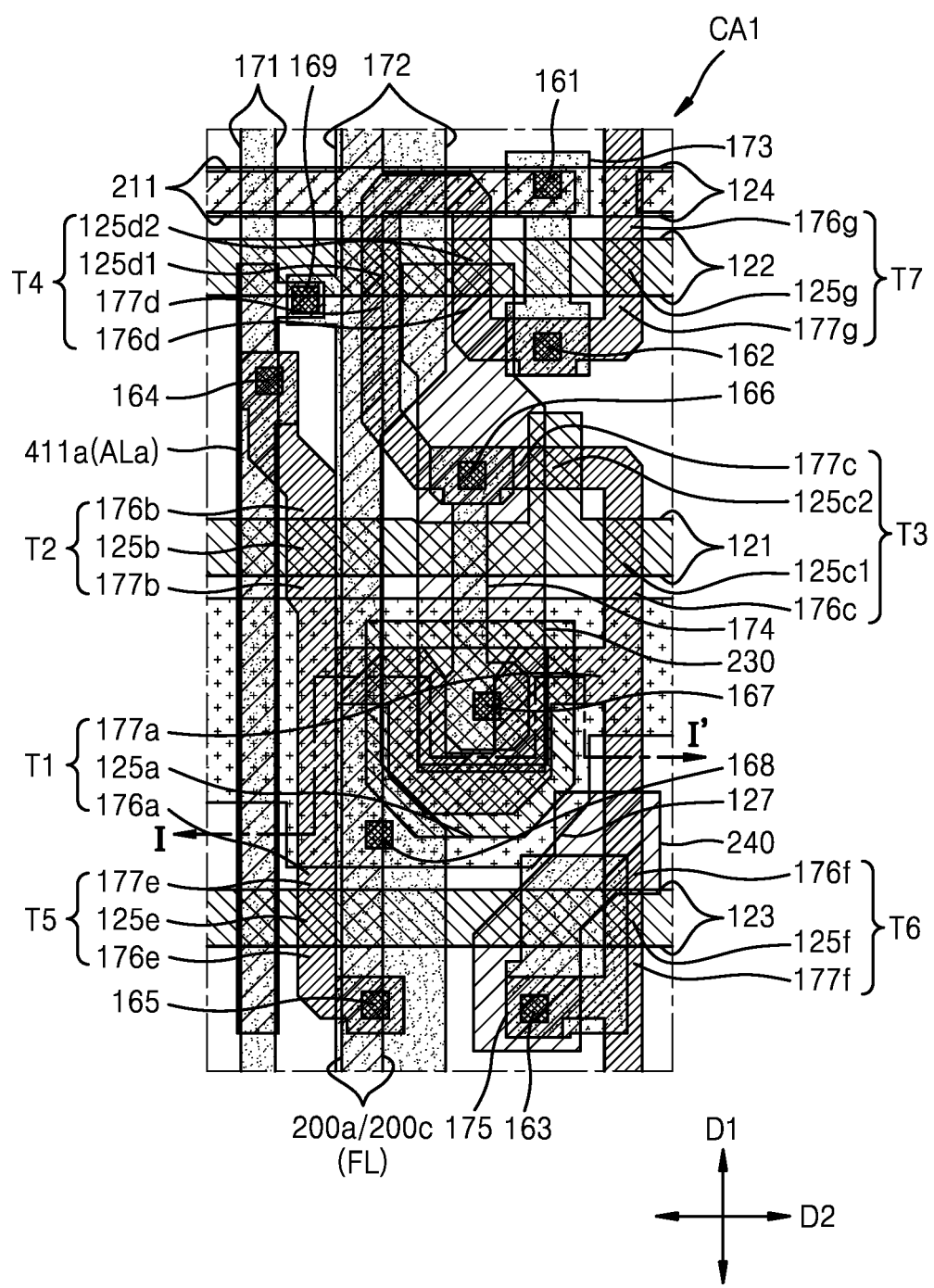
FIG. 24 is a layout view illustrating some elements in FIG. 23 layer by layer.

In FIG. 7, the first auxiliary line ALa is not arranged in the first sub-area SS1. However, the present inventive concept is not limited thereto, and as illustrated in FIGS. 23 and 24, a first portion 411a of the first auxiliary line ALa in some of the first pixel areas CA1 of the first sub-area SS1 may extend in the first direction D1, be parallel to a first portion 200a of a connecting line FL, and overlap the data line 171. The first portion 411a of the first auxiliary line ALa may be connected to the power voltage line 172 through a contact hole 169 formed in the fourth insulating layer 114. As illustrated in FIG. 17A, the power voltage line 172 may include a protrusion 172a protruding toward the data line 171. As illustrated in FIG. 17B, the first portion 411a of the first auxiliary line ALa may include a protrusion 410. The protrusion 410 of the first portion 411a of the first auxiliary line ALa may overlap the protrusion 172a of the power voltage line 172 and be electrically connected to the power voltage line 172 through the contact hole 169.

Figure 25:
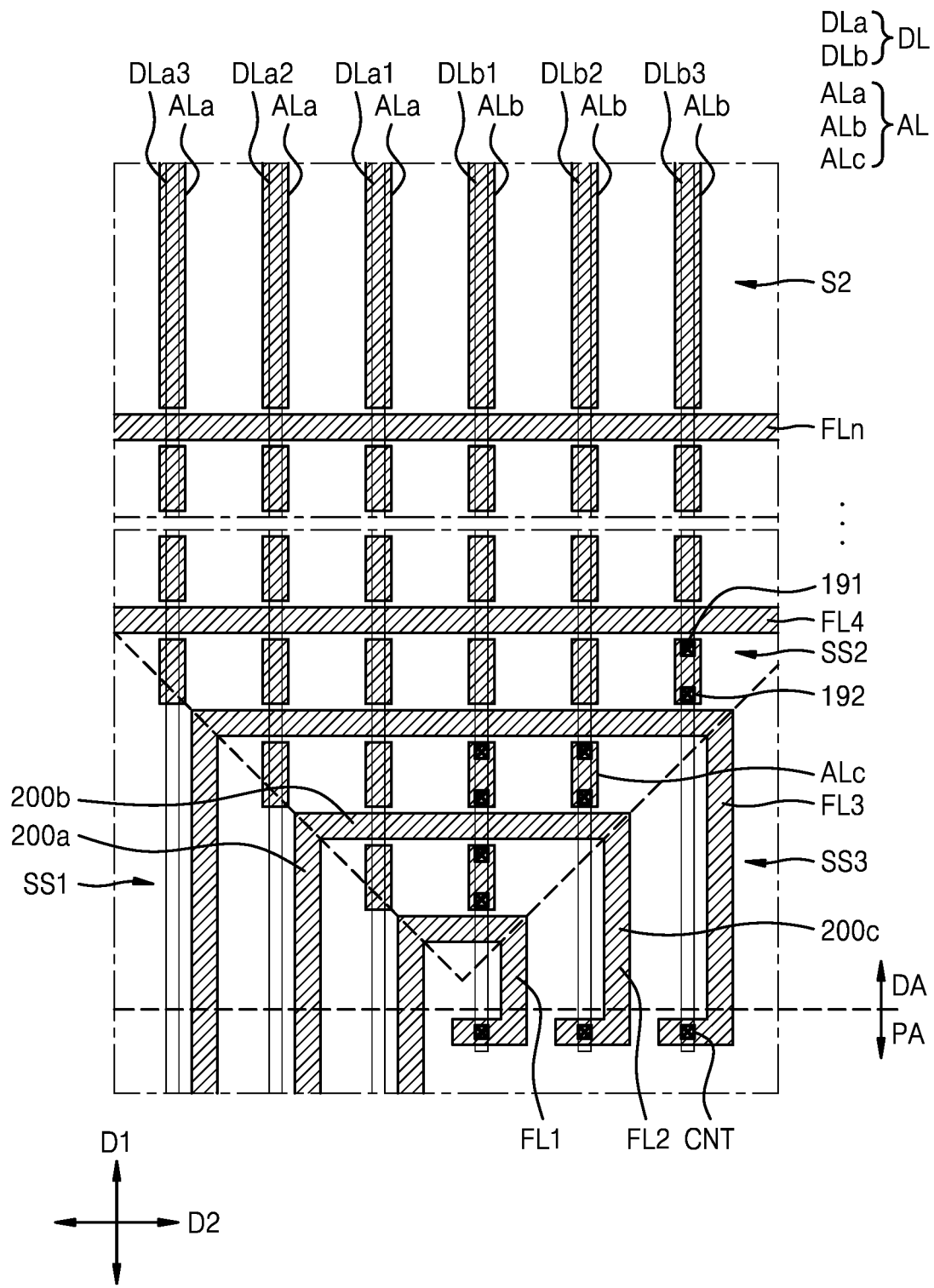
FIGS. 25 and 29 are views illustrating the arrangement of wires of a display device according to another exemplary embodiment of the inventive concept.
Figure 26:
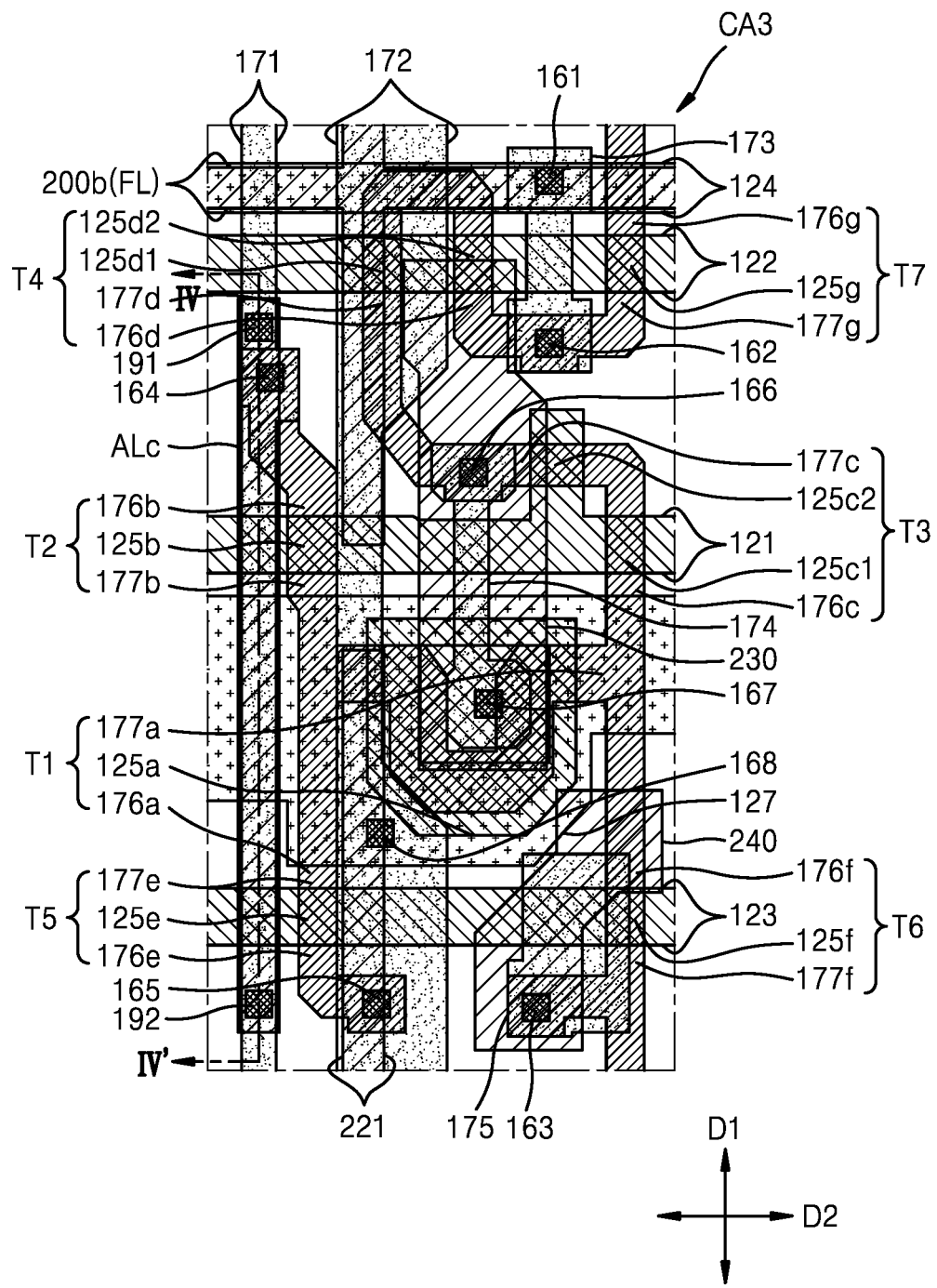
FIG. 26 is a layout view illustrating the positions of a pixel circuit, a connecting line, and the like arranged in a third pixel area of FIG. 25.
Figure 27:
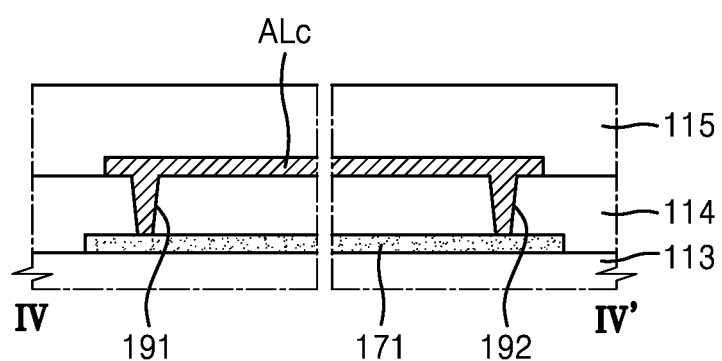
FIG. 27 is a cross-sectional view taken along line IV-IV' of FIG. 26.
Figure 28:
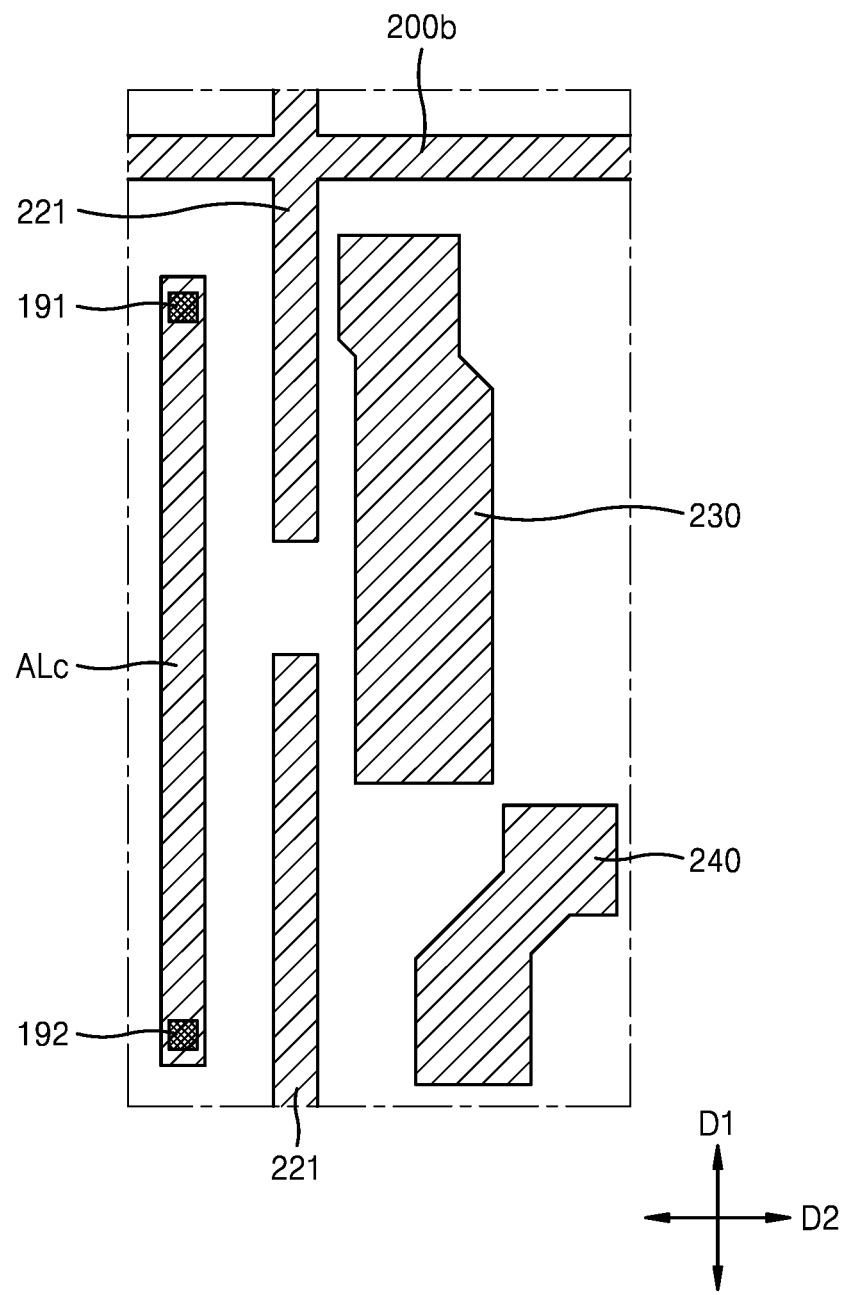
FIG. 28 is a layout view illustrating some elements in FIG. 26.
Figure 29:
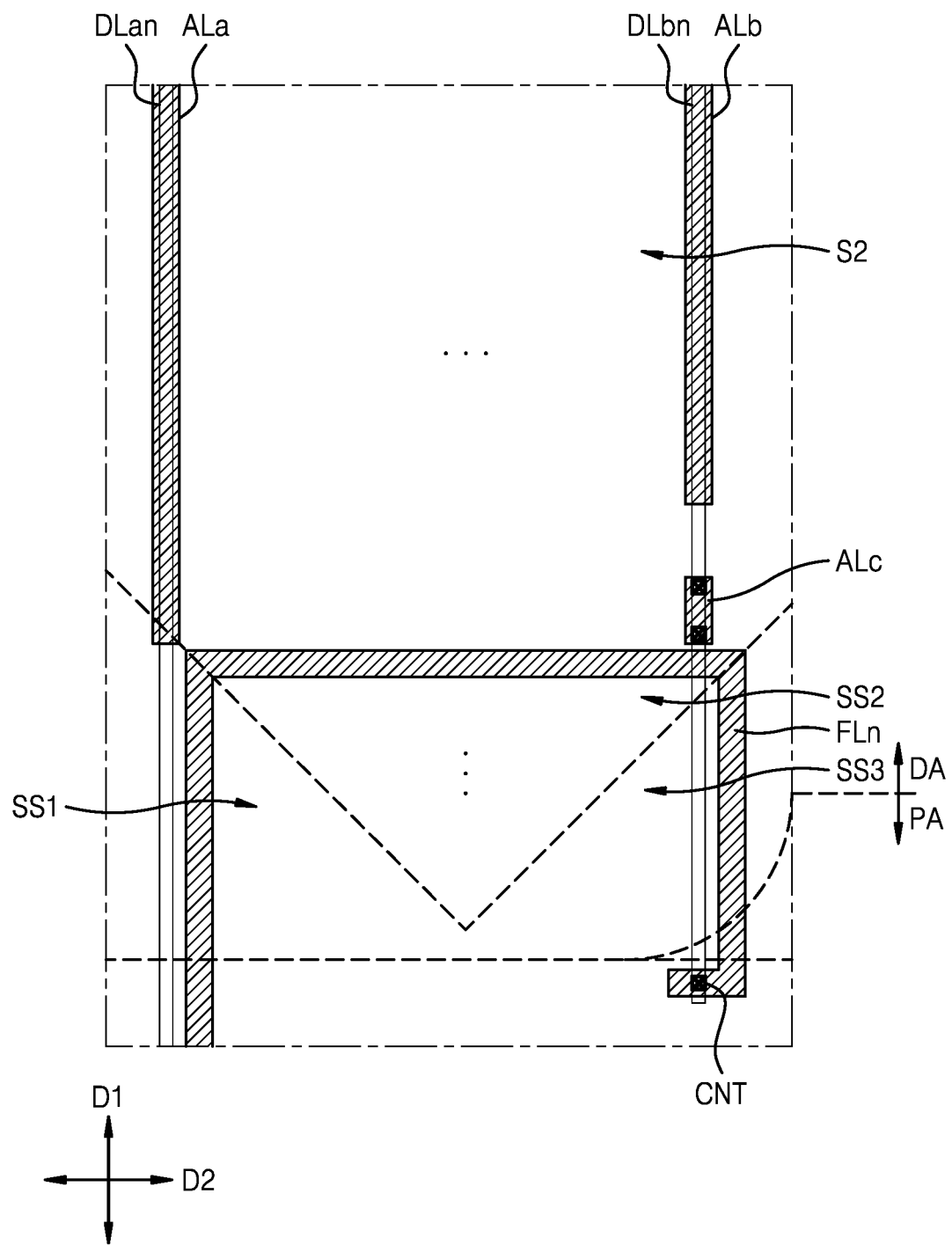
Figure 30:
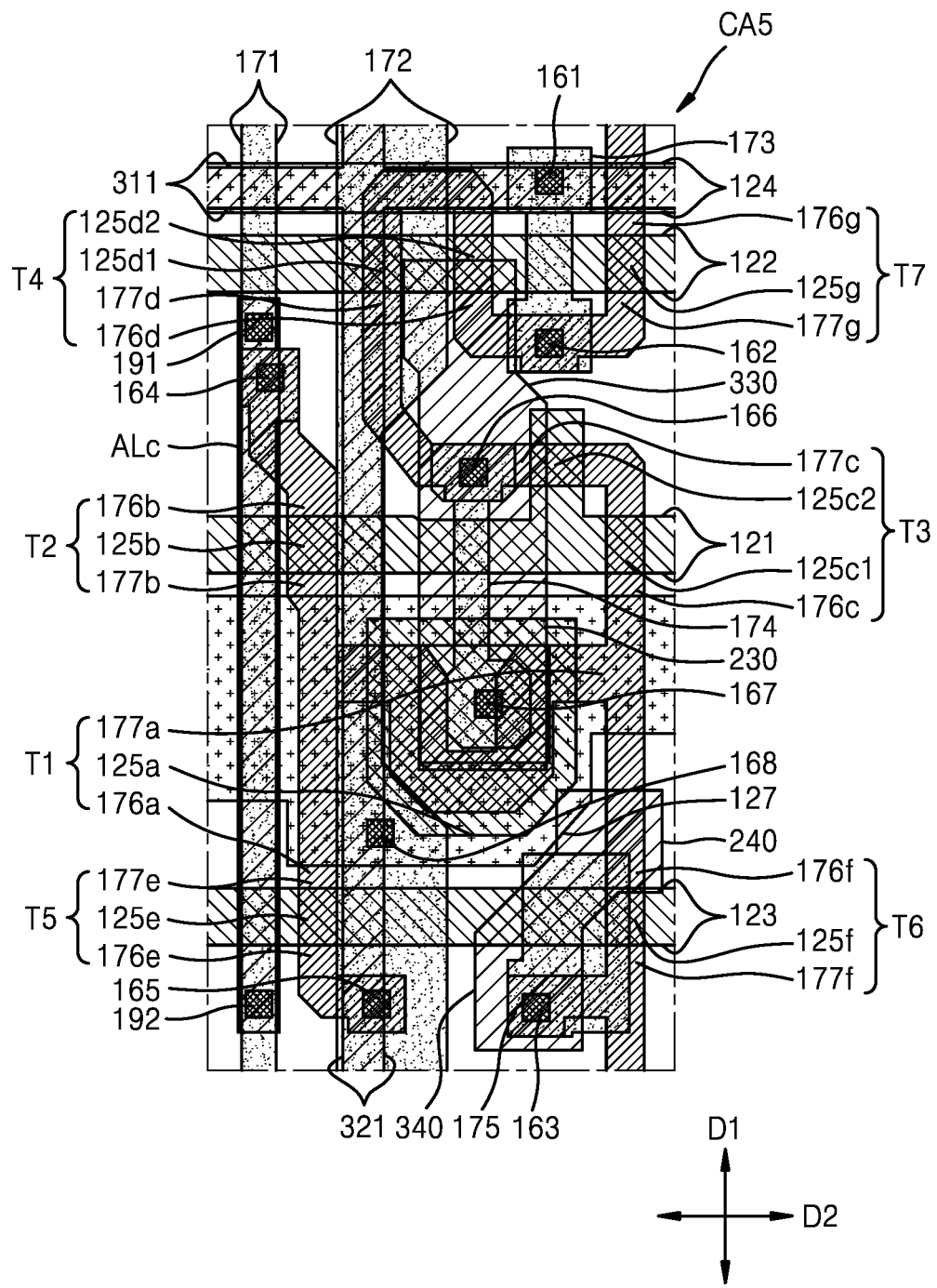
FIG. 30 is a layout view illustrating the positions of a pixel circuit, a connecting line, and the like arranged in a fifth pixel area of FIG. 29.

FIGS. 25 and 29 are view illustrating the arrangement of wires of a display device according to another exemplary embodiment of the inventive concept. FIG. 26 is a layout view illustrating the positions of a pixel circuit, a connecting line, and the like arranged in a third pixel area CA3 of FIG. 25. FIG. 27 is a cross-sectional view taken along line IV-IV' of FIG. 26. FIG. 28 is a layout view illustrating some elements in FIG. 26. FIG. 30 is a layout view illustrating the positions of a pixel circuit, a connecting line, and the like arranged in a fifth pixel area CA5 of FIG. 29.

Referring to FIG. 25, third auxiliary lines ALc may be further provided in the second sub-area SS2 of the display area DA. The third auxiliary lines ALc may extend in the first direction D1, overlap second data lines DLb1 to DLb3, and be electrically connected to the second data lines DLb1 to DLb3 through contact holes 191 and 192 of a fourth insulating layer 114. Since the third auxiliary line ALc is electrically connected to the second data lines DLb1 to DLb3, the second data lines DLb1 to DLb3 may have double wiring structures. Accordingly, the resistances of the second data lines DLb1 to DLb3 may be reduced, thereby reducing the RC delays of the second data lines DLb1 to DLb3.

As illustrated in FIG. 26, a third auxiliary line ALc may be arranged in some of the third pixel area CA3 of the second sub-area 352. The data line 171 illustrated in FIG. 26 may be a first data line DLa or a second data line DLb. Like that illustrated in FIGS. 14A to 14C, transistors (T1-T7) and a capacitor (Cst) may be arranged in the third pixel area CA3, and a third insulating layer 113 may cover the transistors (T1-T7) and the capacitor (Cst).

Referring to FIGS. 26 and 27, the data line 171 and a power voltage line 172 may be arranged on the third insulating layer 113 in the third pixel area CA3. A fourth insulating layer 114 may be arranged on the data line 171 and the power voltage line 172. As illustrated in FIG. 28, a connecting line FL and first and second dummy patterns 230 and 240 may be provided on the fourth insulating layer 114. A fifth insulating layer 115 may be located on the connecting line FL and the first and second dummy patterns 230 and 240. A second portion 200b of the connecting line FL may extend in the second direction D2 and may overlap an initialization voltage line 124. A second branch 221 of the connecting line FL may extend in the first direction D1 and may overlap the power voltage line 172. The first dummy pattern 230 may overlap a node electrode 174, and the second dummy pattern 240 may overlap a connection member 175.

As illustrated in FIG. 28, a third auxiliary line ALc may be further arranged on the fourth insulating layer 114. The third auxiliary line ALc may extend in the first direction D1, be parallel to the second branch 221 of the connecting line FL, and overlap the data line 171. For example, the third auxiliary line ALc may be adjacent to the second branch 221 of the connecting line FL. The third auxiliary line ALc may be connected to the data line 171 through contact holes 191 and 192 formed in the fourth insulating layer 114.

Referring to FIG. 29, third auxiliary lines ALc may be further provided in the second area S2 of the display area DA. The third auxiliary lines ALc may extend in the first direction D1 and overlap the second data lines DLb and may be electrically connected to the second data lines DLb through the contact holes 191 and 192 of the fourth insulating layer 114. The third auxiliary line ALc may be separated from the second auxiliary line ALb and may have a smaller size than the second auxiliary line ALb. FIG. 29 illustrates a third auxiliary line ALc overlapping an n-th second data line DLbn, but, according to an exemplary embodiment of the inventive concept, a third auxiliary line ALc overlapping a corresponding first data line DLa or a corresponding second data line DLb of some of the first to nth connecting lines FL1 to FLn may be provided.

As illustrated in FIG. 30, a third auxiliary line ALc may be arranged in some of the fifth pixel areas CA5 of the second area 32. A data line 171 illustrated in FIG. 30 may be a first data line DLa or a second data line DLb. Like that illustrated in FIGS. 14A to 14C, transistors (T1-T7) and a capacitor (Cst) may be arranged in the fifth pixel area CA5, and a third insulating layer 113 may cover the transistors (T1-T7) and the capacitor (Cst). A data line 171 and a power voltage line 172 may be arranged on the third insulating layer 113. A fourth insulating layer 114 may be arranged on the data line 171 and the power voltage line 172. A dummy line 300 and third and fourth dummy patterns 330 and 340 may be provided on the fourth insulating layer 114. A first portion 321 of the dummy line 300 may extend in the first direction D1 and may overlap the power voltage line 172. A second portion 311 of the dummy line 300 may extend in the second direction D2 and may overlap an initialization voltage line 124. The third dummy pattern 330 may overlap a node electrode 174, and the fourth dummy pattern 340 may overlap a connection member 175. The third auxiliary line ALc may extend in the first direction D1, be parallel to the first portion 321 of the dummy line 300, and overlap the data line 171. The third auxiliary line ALc may be connected to the data line 171 through contact holes 191 and 192 formed in the fourth insulating layer 114.

In the embodiment illustrated in FIGS. 25 to 30, the third auxiliary lines ALc of the first area S1 may be connected to a corresponding second data line DLb of the first area S1. The third auxiliary lines ALc of the second area S2 may be connected to a corresponding second data line DLb of the second area S2.

Although a case in which the third auxiliary line ALc is connected to the data line 171 by two contact holes 191 and 192 is shown in the embodiment of FIGS. 25 to 30, this is merely exemplary and the third auxiliary line ALc may be electrically connected to the data line 171 through one or more contact holes.

According to the embodiment illustrated in FIG. 25, the display device of the present inventive concept may correct an RC deviation between a first data line and a second data line by the adjustment of the capacitance of the first data line and the adjustment of the capacitance and resistance of the second data line.

Figure 31:
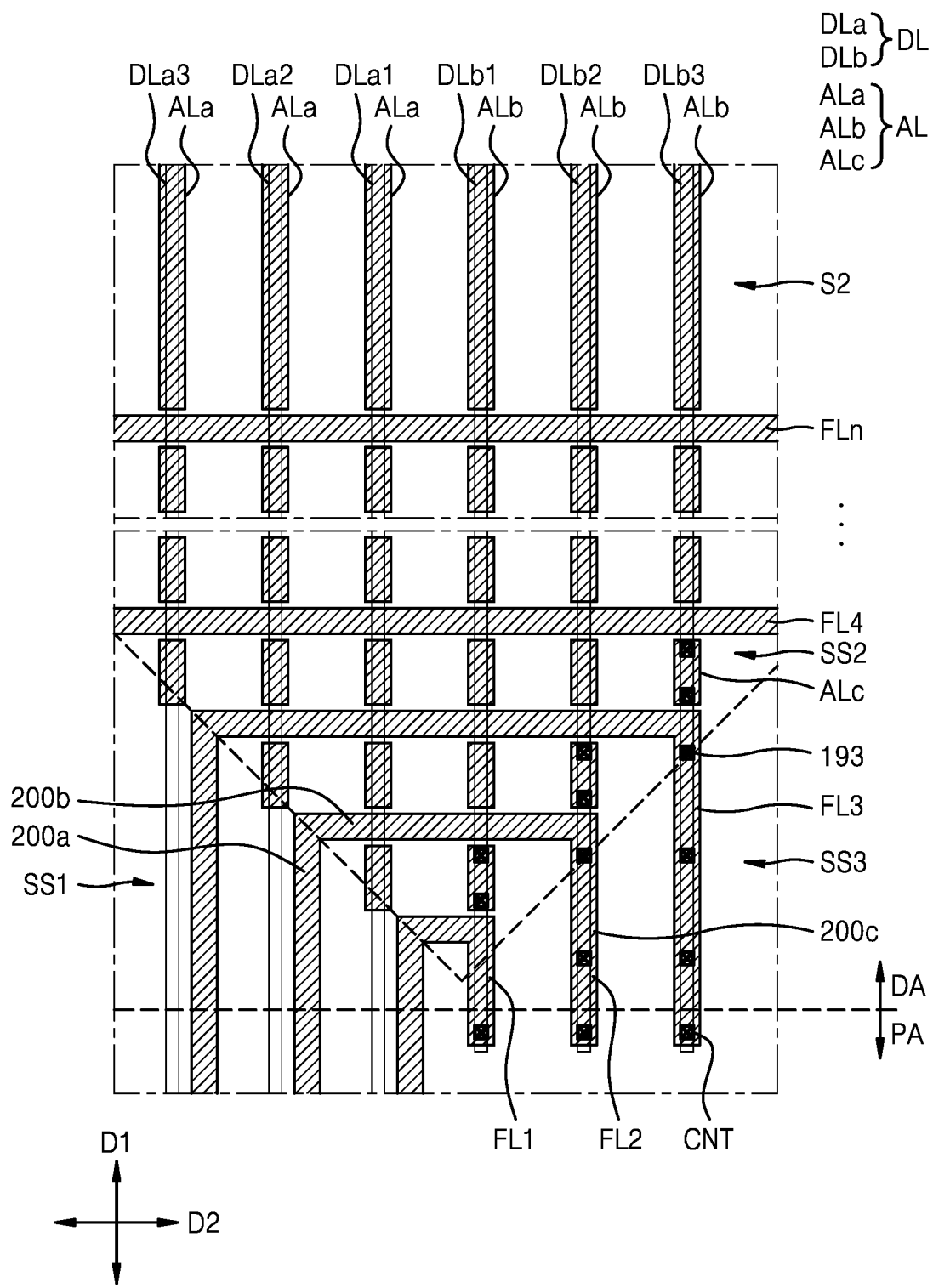
FIG. 31 is a view illustrating the arrangement of wires of a display device according to another exemplary embodiment of the inventive concept.
Figure 32:
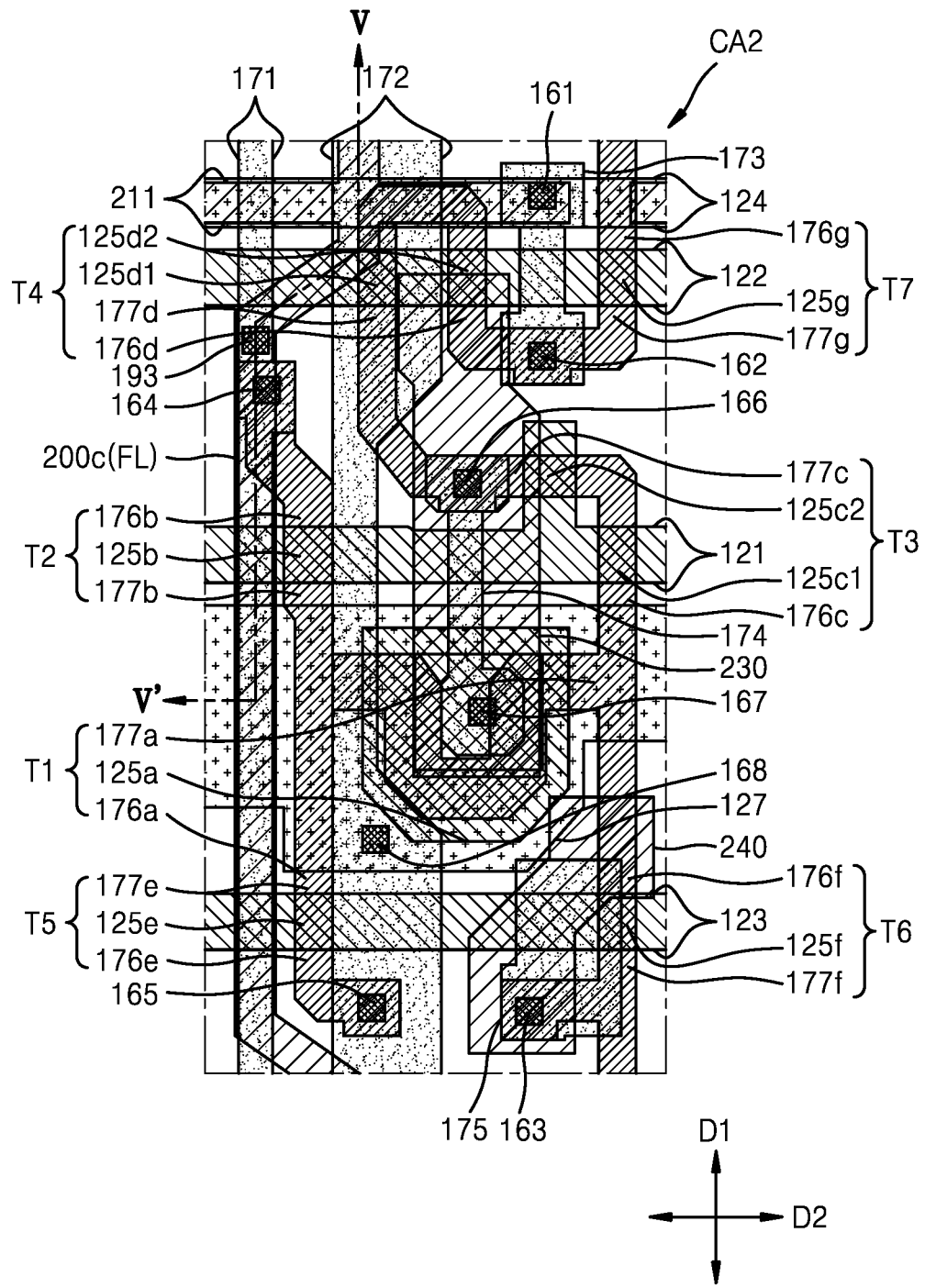
FIG. 32 is a layout view illustrating the positions of a pixel circuit, a connecting line, and the like arranged in a second pixel area of FIG. 31.
Figure 33:
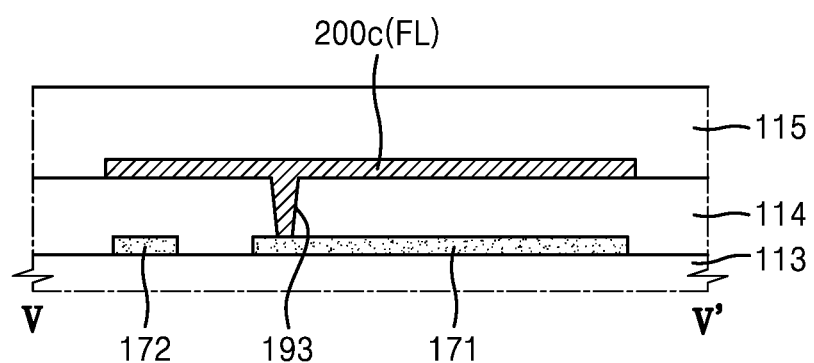
FIG. 33 is a cross-sectional view taken along line V-V' of FIG. 32.

FIG. 31 is a view illustrating the arrangement of wires of a display device according to another exemplary embodiment of the inventive concept. FIG. 32 is a layout view illustrating the positions of a pixel circuit, a connecting line, and the like arranged in a second pixel area CA2 of FIG. 31. FIG. 33 is a cross-sectional view taken along line V-V' of FIG. 32.

Referring to FIG. 31, a third portion 200c of a connecting line FL may overlap a second data line DLb and be connected to the second data line DLb. In other words, an end portion of the third portion 200c of the connecting line FL may be connected to the second data line DLb at a contact portion CNT, and portions of the third portion 200c other than the end portion may be electrically connected to the second data line DLb in pixel units. Accordingly, since the second data line DLb overlapping the third portion 200c of the connecting line FL has a double wiring structure, wiring resistance may be reduced.

Referring to FIGS. 32 and 33, a third portion 200c of the connecting line FL may overlap the data line 171 in some of the second pixel areas CA2 of the third sub-area SS3. The third portion 200c of the connecting line FL may be connected to the data line 171 through a contact hole 193 of a fourth insulating layer 114.

Although a case in which the third portion 200c of the connecting line FL is connected to the data line 171 by one contact hole 193 is shown in the embodiment of FIGS. 31 to 33, this is merely exemplary and the third portion 200c of the connecting line FL may be electrically connected to the data line 171 through one or more contact holes.

According to the embodiment illustrated in FIG. 31, the display device of the present inventive concept may correct an RC deviation between a first data line and a second data line by the adjustment of the capacitance of the first data line and the adjustment of the capacitance and resistance of the second data line.

Figure 34:
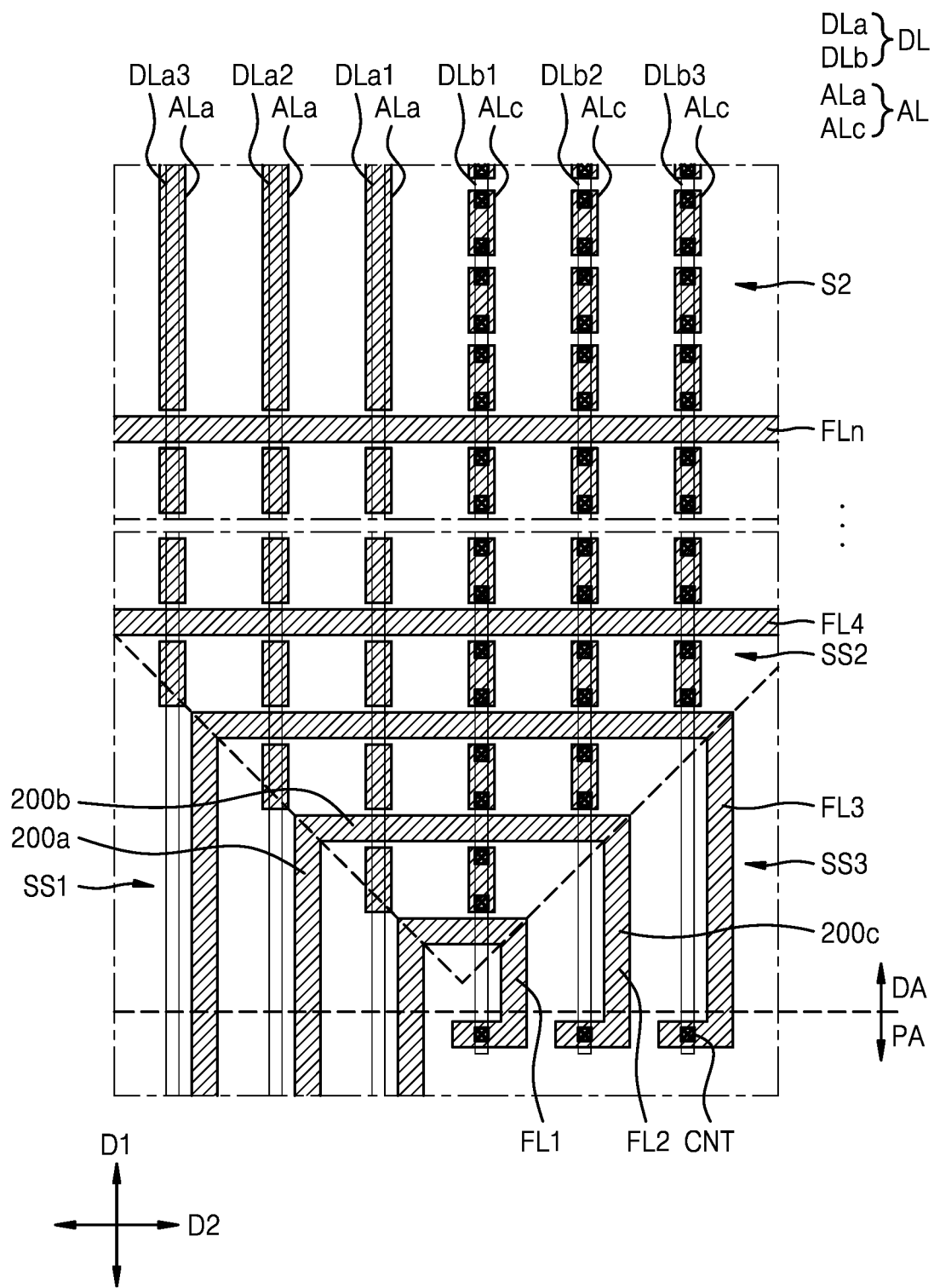
FIGS. 34 and 35 are views illustrating the arrangement of wires of a display device according to another exemplary embodiment of the inventive concept.

FIG. 34 is a view illustrating the arrangement of wires of a display device according to another exemplary embodiment of the inventive concept.

Referring to FIG. 34, first auxiliary lines ALa may be arranged on first data lines DLa1 to DLa3, and third auxiliary lines ALc may be arranged on second data lines DLb1 to DLb3. The first auxiliary lines ALa may overlap the first data lines DLa1 to DLa3 in the second sub-area 552 and the second area S2. The third auxiliary lines ALc may overlap the second data lines DLb1 to DLb3 in the second sub-area SS2 and the second area S2.

The first auxiliary lines ALa may be electrically connected to a corresponding power voltage line PL in the second sub-area SS2 and receive the first power voltage ELVDD. The first auxiliary lines ALa may be integrally formed with a dummy line 300 in the second area S2 and receive the first power voltage ELVDD. The third auxiliary lines ALc may be electrically connected to corresponding first and second data lines DLa and DLb in the second sub-area SS2 and the second area S2.

In the embodiment illustrated in FIG. 34, the first auxiliary lines ALa of the first area S1 may be connected to a corresponding power voltage line of the first area S1. The first auxiliary lines ALa of the second area S2 may be connected to a corresponding power voltage line of the second area S2. The third auxiliary lines ALc of the first area S1 may be connected to a corresponding second data line DLb of the first area S1 The third auxiliary lines ALc of the second area S2 may be connected to a corresponding second data line DLb of the second area 32.

According to the embodiment illustrated in FIG. 34, the display device of the present inventive concept may correct an RC deviation between a first data line and a second data line by the adjustment of the capacitance of the first data line and the adjustment of the resistance of the second data line.

Figure 35:
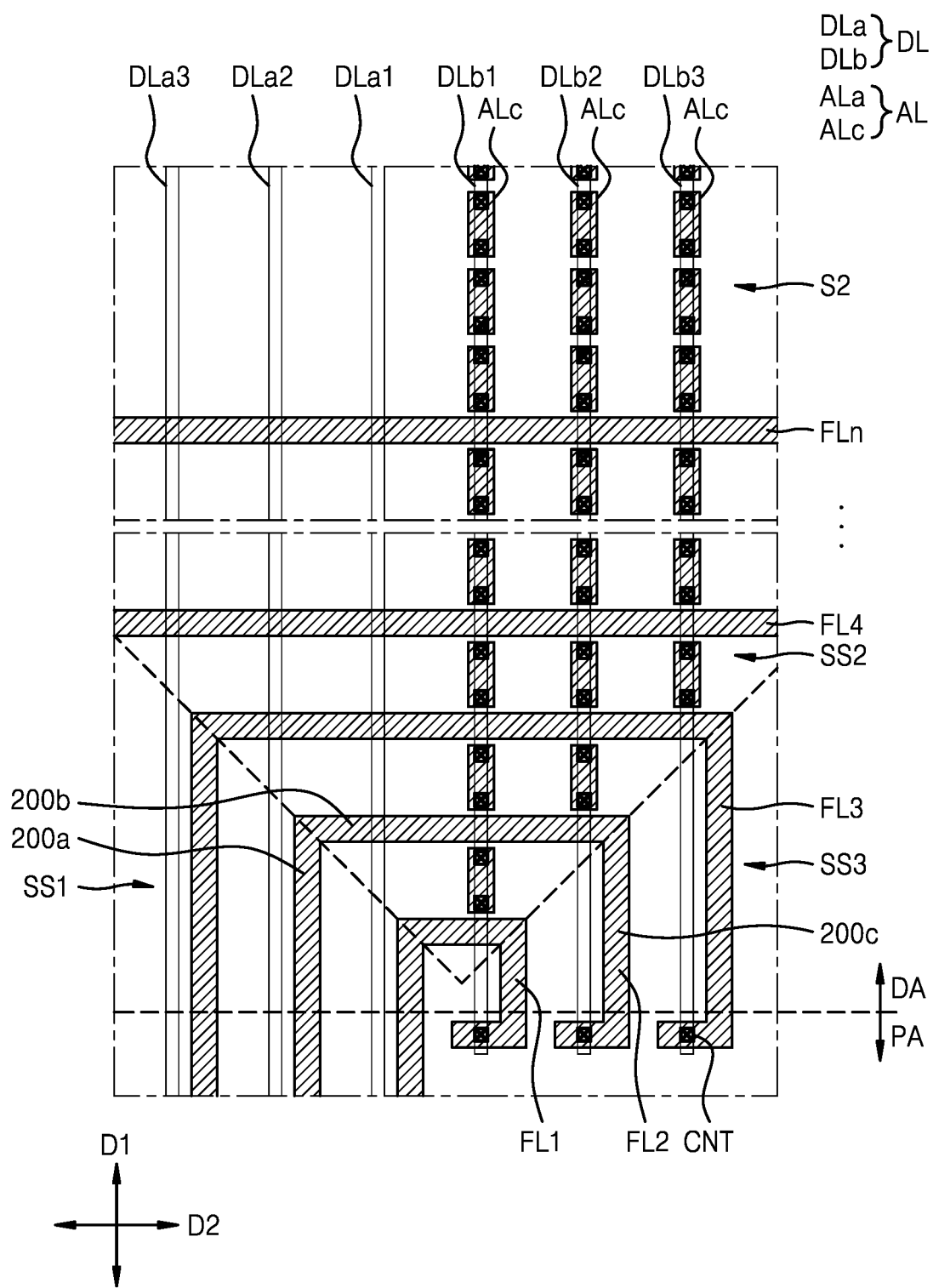

FIG. 35 is a view illustrating the arrangement of wires of a display device according to another exemplary embodiment of the inventive concept.

The embodiment illustrated in FIG. 35 differs from the embodiment illustrated in FIG. 34 in that the first auxiliary lines ALa are not arranged on the first data lines DLa1 to DLa3. The embodiment illustrated in FIG. 35 is the same as the embodiment illustrated in FIG. 34 except for the aforementioned difference. In other words, in the embodiment illustrated in FIG. 35, the third auxiliary lines ALc of the first area S1 may be connected to corresponding second data line DLb of the first area S1. The third auxiliary lines ALc of the second area S2 may be connected to corresponding second data line DLb of the second area S2.

According to the embodiments described above, a display device capable of stably transmitting a data signal to a pixel through RC correction of data lines of a display area is provided. The scope of the present inventive concept is not limited by these effects.

For example, exemplary embodiments of the inventive concept also include a display device in which a dead space is decreased.

While the inventive concept has been described with reference to one or more exemplary embodiments thereof, it will be understood by those of ordinary skill in the art that various changes in form and details may be made thereto without departing from the spirit and scope of the inventive concept as set forth in the following claims.

What is claimed is:

1. A display device, comprising:
a substrate having a display area including a first area and a second area;
a first data line arranged in the first area and the second area and extending in a first direction;
a connecting line arranged in the first area, the connecting line including a first portion and a third portion extending in the first direction and spaced apart from each other and a second portion between the first portion and the third portion, the second portion extending in a second direction perpendicular to the first direction and being connected to the first portion and the second portion; and
a first auxiliary line arranged in the second area, extending in the first direction and overlapping the first data line.

2. The display device of claim 1, further comprising:
a power line arranged in the first area and the second area and extending in the first direction,
wherein the first auxiliary line is connected to the power line.

3. The display device of claim 1, wherein
the first auxiliary line is connected to the data line.

4. The display device of claim 1, further comprising:
a second data line parallel and adjacent to the first data line,
a second auxiliary line arranged in the first area and overlapping the first data line; and
a third auxiliary line arranged in the first area and overlapping the second data line,
wherein the first portion of the connecting line is parallel to the first data line and the third portion of the connecting line is parallel to the second data line.

5. The display device of claim 4, wherein
the third auxiliary line is connected to the second data line.

6. The display device of claim 4, wherein
the third portion of the connecting line is connected to the second data line.

7. The display device of claim 4, further comprising:
a power line arranged in the first area and the second area and extending in the first direction,
wherein the second auxiliary line is connected to the power line.

* * * * *